United States Patent [19]

Kimura

[11] Patent Number: 5,774,020
[45] Date of Patent: Jun. 30, 1998

[54] OPERATIONAL TRANSCONDUCTANCE AMPLIFIER AND MULTIPLIER

[75] Inventor: Katsuji Kimura, Tokyo, Japan

[73] Assignee: NEC Corporation, Tokyo, Japan

[21] Appl. No.: 731,467

[22] Filed: Oct. 15, 1996

[30] Foreign Application Priority Data

Oct. 13, 1995 [JP] Japan .................................. 7-291955

[51] Int. Cl.$^6$ ........................................................ H03F 3/45
[52] U.S. Cl. ........................... 330/252; 330/253; 330/257; 327/359
[58] Field of Search .................................. 330/252, 253, 330/257; 327/356, 357, 359

[56] References Cited

U.S. PATENT DOCUMENTS

| | | | |
|---|---|---|---|
| 4,229,705 | 10/1980 | Takahashi et al. | ........... 330/261 X |
| 4,390,848 | 6/1983 | Blauschild | ........... 330/151 |
| 4,820,997 | 4/1989 | Sano et al. | ........... 330/252 |
| 5,107,150 | 4/1992 | Kimura . | |
| 5,138,276 | 8/1992 | Marie | ........... 330/252 |
| 5,187,682 | 2/1993 | Kimura . | |
| 5,345,237 | 9/1994 | Kouno et al. | ........... 330/252 X |
| 5,438,296 | 8/1995 | Kimura . | |
| 5,481,224 | 1/1996 | Kimura . | |
| 5,485,119 | 1/1996 | Kimura . | |
| 5,500,623 | 3/1996 | Kimura . | |
| 5,512,855 | 4/1996 | Kimura . | |
| 5,521,542 | 5/1996 | Kimura . | |
| 5,523,717 | 6/1996 | Kimura . | |
| 5,552,734 | 9/1996 | Kimura . | |
| 5,561,392 | 10/1996 | Kimura . | |
| 5,578,965 | 11/1996 | Kimura . | |
| 5,581,210 | 12/1996 | Kimura . | |
| 5,581,211 | 12/1996 | Kimura . | |

FOREIGN PATENT DOCUMENTS

0344855A1  6/1989  European Pat. Off. .......... H03F 3/45

OTHER PUBLICATIONS

M. Hirota et al., "Low Voltage Type Bipolar–OTA", Proceedings of the 1994 IEICE Fall Conference, No. A–12.

Primary Examiner—James B. Mullins
Attorney, Agent, or Firm—Sughrue, Mion, Zinn, Macpeak & Seas, PLLC

[57] ABSTRACT

A bipolar or MOS OTA is provided, in which no S/N degradation occurs due to compression and expansion of a signal, and low voltage operation can be realized at a power supply voltage of approximately 2 V for the input voltage range of approximately 1 V peak-to-peak or greater. This OTA includes a first differential pair of first and second transistors respectively driven by first and second current sources or sinks. A first resistor is connected to emitters or sources of the first and second transistors. A differential input signal is applied across these emitters or sources. This OTA further includes a second differential pair of third and fourth transistors. A second resistor is connected to emitters or sources of the third and fourth transistors. A current path is connected to the emitters or sources of the third and fourth transistors, thereby allowing a current to flow through the second resistor. The connection of the first and second pairs are so designed that each of the currents flowing through the third and fourth transistors contains a component proportional to the input signal. An output signal is derived from one of the emitters or sources of the third and fourth transistors.

19 Claims, 16 Drawing Sheets

OPERATIONAL TRANSCONDUCTANCE AMPLIFIER AND MULTIPLIER

BACKGROUND OF THE INVENTION

1. Field of the Invention

The present invention relates to a differential amplifier circuit comprised of bipolar transistors or Metal-Oxide Semiconductor Field-Effect Transistors (MOSFETs) and more particularly, to a differential amplifier circuit having an improved transconductance linearity within a wide input voltage range, which is formed on a bipolar or MOS semiconductor integrated circuit device (IC) and is operable at a low supply voltage, and a multiplier using the differential amplifier circuit.

2. Description of the Prior Art

A differential amplifier circuit having a superior transconductance linearity within a comparatively wide input voltage range has been known as an "Operational Transconductance Amplifier (OTA)".

An example of the conventional bipolar OTAs is shown in FIG. 1, which is termed "Gilbert gain cell".

As shown in FIG. 1, a first differential pair is composed of npn bipolar transistors Q101 and Q102. An emitter of the transistor Q101 is connected to one end of a constant current sink sinking a constant current $I_1$. An emitter of the transistor Q102 is connected to one end of another constant current sink sinking the same constant current $I_1$ as that of the sink for the transistor Q101. The other ends of the two current sinks are coupled together to be grounded. The transistors Q101 and Q102 are driven by the corresponding current sinks, respectively.

The emitters of the transistors Q101 and Q102 are connected to each other through a resistor R101 having a resistance R.

Bases of the transistors Q101 and Q102 are connected to a pair of input terminals T101 and T102, respectively.

A differential input voltage $V_{IN}$ as an input signal of the conventional OTA is applied across the pair of input terminals T101 and T102.

Two diode-connected npn bipolar transistors Q103 and Q104 are provided to serve as loads of the transistors Q101 and Q102, respectively. Specifically, collectors of the transistors Q101 and Q102 are connected to emitters of the transistors Q103 and Q104, respectively. A base and a collector of the transistor Q103 are coupled together to be connected to a power supply terminal T105, which is applied with a power supply voltage $V_{CC}$. A base and a collector of the transistor Q104 are coupled together to be connected to the power supply terminal T105.

A second differential pair is composed of npn bipolar transistors Q105 and Q106. Emitters of the transistors Q105 and Q106 are coupled together to be connected to one end of a constant current sink sinking a constant current $2I_2$. The other end of the current sink is grounded. Bases of the transistors Q105 and Q106 are connected to the collectors of the transistors Q101 and Q102, respectively.

A collector of the transistor Q105 is connected to one end of a constant current source supplying a constant current $I_2$. The other end of the current source is connected to the power supply terminal T105. A collector of the transistor Q106 is connected to one end of another constant current source supplying the same constant current $I_2$ as that of the current source for the transistor Q105. The other end of the current source is connected to the power supply terminal T105.

The collectors of the transistors Q105 and Q106 are further connected to a pair of output terminals T103 and T104, respectively.

Output currents $I_{OUT1}$ and $I_{OUT2}$ are differentially derived from the pair of output terminals T103 and T104, respectively, resulting in a differential output current $\Delta I_{OUT}$ as an amplified output signal of the OTA, which is defined as $\Delta I_{OUT} = I_{OUT1} - I_{OUT2}$.

Next, the operation of the conventional Gilbert gain cell of FIG. 1 is explained below.

Here, supposing that the base-width modulation (i.e., the Early voltage) is ignored, a collector current $I_C$ of a bipolar transistor is typically expressed as the following equation (1).

$$I_C = I_S \exp\left(\frac{V_{BE}}{V_T}\right) \tag{1}$$

In the equation (1), $V_{BE}$ is the base-to-emitter voltage of the transistor, and $I_S$ is the saturation current thereof. $V_T$ is the thermal voltage defined as $V_T = kT/q$, where k is the Boltzmann's constant, T is absolute temperature in degrees Kelvin, and q is the charge of an electron.

When the differential input voltage $V_{IN}$ is applied across the bases of the transistors Q101 and Q102 of the first differential pair, the following equation (2) is established around the loop consisting of the input voltage and the two base-emitter junctions because of the Kirchhoff's voltage law $$V_{IN} = V_{BE1} - V_{BE2} + Ri \tag{2}$$

where $V_{BE1}$ and $V_{BE2}$ are the base-to-emitter voltages of the transistors Q101 and Q102, and i is a current flowing through the emitter resistor R101.

Supposing that $R\,i > V_{BE1} - V_{BE2}$ is established, the current i is expressed as the following equation (3).

$$i = \frac{V_{IN} - (V_{BE1} - V_{BE2})}{R} \approx \frac{V_{IN}}{R} \tag{3}$$

The current i flowing through the emitter resistor R101 further flows the diode-connected transistors Q3 and Q4 as a differential current, resulting in a differential output voltage $V_O$ between the emitters of the transistors Q103 and Q104 (or, collectors of the transistors Q101 and Q102). The differential output voltage $V_O$ is expressed by the following equation (3a) as $$V_O = V_T \ln\left(\frac{i}{I_S}\right) \tag{3a}$$

It is seen from the equation (3a) that the output voltage $V_O$ is in a logarithmically compressed form of the current i. This means that the voltage $V_o$ is logarithmically proportional to the current i.

The differential output voltage $V_O$ is then applied across the bases of the transistors Q105 and Q106 to be amplified, resulting in the differential output current $\Delta I_{OUT}$ as an amplified output signal of $V_O$.

Typically, in a balanced differential pair of two bipolar transistors having no emitter resistor, a differential output current is approximately, exponentially proportional to a differential input voltage. Accordingly, the differential output current $\Delta I_{OUT}$ is in an exponentially expanded form of the differential output voltage $V_O$.

Thus, the current $\Delta I_{OUT}$ is proportional to the current i flowing through the resistor R101. This means that the current i can be derived from the pair of output terminals T103 and T104.

With the conventional Gilbert gain cell shown in FIG. 1, however, a problem that a complete linear behavior cannot be realized occurs, because it contains the approximation as shown in the equation (3). Satisfactory linearity in the OTA behavior can be realized only when the value of the resistance R of the emitter resistor R101 and the values of the constant currents $I_1$ and $I_2$ are suitably designed.

The conventional Gilbert gain cell of FIG. 1 has another problem that the signal-to-noise ratio (S/N) of the cell is remarkably degraded and that the suitable design of the circuit elements is complicated.

To improve the conventional Gilbert gain cell to thereby realize the complete linearity in the OTA behavior, a bipolar OTA shown in FIG. 2 was proposed in Proceedings of the 1994 IEICE fall conference, No. A-12.

As shown in FIG. 2, a first differential pair is composed of npn bipolar transistors Q201 and Q202. An emitter of the transistor Q201 is connected to one end of a constant current sink sinking a constant current $I_0$. An emitter of the transistor Q202 is connected to one end of another constant current sink sinking the same constant current $I_0$ as that of the sink for the transistor Q201. The other ends of the two current sinks are grounded. The transistors Q201 and Q202 are driven by the corresponding current sinks, respectively.

The emitters of the transistors Q201 and Q202 are connected to each other through a resistor R201 having a resistance R.

Bases of the transistors Q201 and Q202 are connected to a pair of input terminals T201 and T202, respectively.

A differential input voltage $V_{IN}$ as an input signal of the conventional OTA of FIG. 2 is applied across the pair of input terminals T201 and T202.

Two constant current sources supplying the same constant current $2I_0$ are provided for loads of the respective transistors Q201 and Q202. Collectors of the transistor Q201 and Q202 are connected to ends of the corresponding current sources, respectively.

A second differential pair is composed of npn bipolar transistors Q203 and Q204. Emitters of the transistors Q203 and Q204 are connected to each other through an emitter resistor R202 having the same resistance R as that of the resistor R201. Collectors of the transistors Q203 and Q204 are connected to the ends of the corresponding current sources, respectively. Bases of the transistors Q203 and Q204 are commonly connected to a positive end of a constant voltage source supplying a dc constant voltage $V_b$.

A third differential pair is composed of npn bipolar transistors Q205 and Q206. Emitters of the transistors Q205 and Q206 are directly coupled together to be connected one end of a constant current source supplying a constant current $2I_0$. Collectors of the transistors Q205 and Q206 are connected to the emitters of the transistors Q203 and Q204, respectively.

An npn transistor Q209 and a constant current source supplying a constant current $I_b$ are provided for the transistor Q205. An emitter of the transistor Q209 is connected to one end of the current source and the other end thereof is connected to a power supply terminal (not shown) to be applied with a power supply voltage $V_{CC}$. The other end of this current source is grounded. A base of the transistor Q209 is connected to the collector of the transistor Q203.

Similarly, an npn transistor Q210 and a constant current source supplying the same constant current $I_b$ as that of the current source for the transistor Q209 are provided for the transistor Q206. An emitter of the transistor Q210 is connected to one end of this current source and the other end thereof is connected to the power supply terminal to be applied with the power supply voltage $V_{CC}$. The other end of this current source is grounded. A base of the transistor Q210 is connected to the collector of the transistor Q204.

The transistors Q209 and its corresponding constant current sink sinking the current $I_b$ have a function of level-shifting the currents $I_5$ flowing through the transistor Q205. The transistors Q210 and its corresponding constant current sink sinking the current $I_b$ have a function of level-shifting the currents $I_6$ flowing through the transistor Q206.

The two constant current sources supplying the same constant current $2I_0$, which serve as the loads of the respective transistors Q201 and Q202, commonly serve as loads of the respective transistors Q203 and Q204.

A fourth differential pair is composed of npn bipolar transistors Q207 and Q208. Emitters of the transistors Q207 and Q208 are coupled together to be connected one end of a constant current source supplying a constant current $2KI_0$. Collectors of the transistors Q207 and Q208 are connected to ends of two current sources supplying the same constant current $KI_0$, respectively. The other ends of the two current sources are connected to the power supply terminal to be applied with the power supply voltage $V_{CC}$.

Collectors of the transistors Q207 and Q208 are connected to a pair of output terminals T203 and T204, respectively.

Output currents $I_{OUT1}$ and $I_{OUT2}$ are differentially derived from the pair of output terminals T203 and T204, respectively, resulting in a differential output current $\Delta I_{OUT}$ as an amplified output signal of the improved OTA, which is defined as $\Delta I_{OUT} = I_{OUT1} - I_{OUT2}$.

The first differential pair including the resistor R201 constitutes an input circuit or stage S1. The second and third differential pairs including the resistor R202 constitute a non-linearity compensation circuit S2 for compensating the non-linearity of the input voltage $V_{IN}$. The fourth differential pair constitutes an output circuit or stage S3.

Next, the operation of the conventional improved OTA of FIG. 2 is explained below.

When the differential input voltage $V_{IN}$ is applied across the bases of the transistors Q201 and Q202 of the first differential pair, the following equation (4) is established around the loop consisting of the input voltage and the two base-emitter junctions because of the Kirchhoff's voltage law $$V_{IN} = V_{BE1} - V_{BE2} + Ri_R \quad (4)$$

where $V_{BB1}$ and $V_{BE2}$ are the base-to-emitter voltages of the transistors Q201 and Q202, and $i_R$ is a current flowing through the emitter resistor R201.

From the equation (5), the current $i_R$ is expressed by the following equation as $$i_R = \frac{V_{IN} - (V_{BE1} - V_{BE2})}{R} \quad (5)$$

In this conventional OTA shown in FIG. 2, the two current sources supplying the same current $2I_0$ are commonly used as the loads for the first differential pair of the transistors Q201 and Q202 and the second differential pair of the transistors Q203 and Q204. Therefore, the collector currents of the transistors Q201 and Q203 are equal and as a result, the base-to-emitter voltages $V_{BE1}$ and $V_{BE3}$ are equal. Similarly, the collector currents of the transistors Q202 and Q204 are equal and as a result, the base-to-emitter voltages $V_{BB2}$ and $V_{BB4}$ are equal.

Since the emitter resistor R202 for the transistors Q203 and Q204 has the same resistance value R as that of the resistor R201, a current $i_R'$ flowing through the resistor R202 can be expressed as the following equation (6).

$$i_R' = \frac{V_{BE4} - V_{BE3}}{R} \qquad (6)$$

$$= -\frac{V_{BE1} - V_{BE2}}{R}$$

Accordingly, currents $I_5$ and $I_6$ flowing through the transistors Q205 and Q206 can be obtained as the following equations (7) and (8), respectively.

$$I_5 = I_o + i_R - i_R' = I_o + \frac{V_{IN}}{R} \qquad (7)$$

$$I_6 = I_0 - i_R + i_R' = I_0 - \frac{V_{IN}}{R} \qquad (8)$$

It is seen from the equations (7) and (8) that an output voltage $V_O$ between the bases of the transistors Q205 and Q206 is proportional to a differential current defined as $(I_5-I_6)=(2V_{IN}/R)$.

The output voltage is inputted into the fourth differential pair of the transistors Q201 and Q208 and therefore, a differential output current $\Delta I_{OUT}$ ($=I_{OUT1}-I_{OUT2}$), which is derived from the collectors of the transistors Q207 and Q208 and is proportional to ($2V_{IN}/R$), can be obtained.

Since the current $i_R'$ flowing through the emitter resistor R202 shown by the equation (6) is supplied from the transistors Q205 and Q206, the equation (6) is established only under the condition that both of the currents flowing through the transistors Q205 and Q206 are greater than the value of $[(V_{BE4}-V_{BE3})/R]$.

Although the conventional, improved bipolar OTA shown in FIG. 2 realizes a completely linear OTA behavior, it has the same problem that the signal-to-noise ratio (S/N) is remarkably degraded as in the Gilbert gain cell.

Additionally, when the input voltage $V_{IN}$ has a high value within the possible operation range of the first differential pair, the resistance of the resistor R202 will have a high value, resulting in non-linearity increase. Considering that the high resistance of the resistor R202 degrades the frequency characteristics, it is preferred that the resistance has as low a value as possible. However, in this case, a sufficient value of the current $i_R'$ cannot be supplied and therefore, no linear operation is realized.

For example, when the collector currents $I_{C203}$ and $I_{C204}$ of the transistors Q203 and Q204 are $I_{C203}$=0.01 $I_0$ and $I_{C204}$=1.99 $I_0$, the difference $\Delta V_{BE}$ of the base-to-emitter voltages of the transistors Q203 and Q204 is expressed as $\Delta V_{BE}$=4.78 $V_T \approx$123.5 mv (at room temperature), where $V_t$ is the thermal voltage.

If $I_0$=100 μA, the resistance $R_{202}$ of the resistor R202 is expressed as $R_{202}$=123.5 kΩ. This is a very high value.

When $I_{C203}$=0.001 $I_0$ and $I_{C204}$=1.999 $I_0$, $\Delta V_{BE}$=7.6 $V_T \approx$196.5 mV (at room temperature).

If $I_0$=100 μA, $R_{202}$=2 MΩ is obtained.

Further, the differential output current of the conventional, improved bipolar OTA of FIG. 2 can be designed to use with the well-known Gilbert multiplier cell as shown in FIG. 3.

In FIG. 3, npn bipolar transistors Q301 and Q302 form a first emitter-coupled differential pair, npn bipolar transistors Q303 and Q304 form a second emitter-coupled differential pair, and npn bipolar transistors Q305 and Q306 form a third emitter-coupled differential pair. Collectors of the transistors Q301, Q302, Q303 and Q304 are cross-coupled. A collector of the transistor Q305 is connected to the coupled emitters of the transistors Q301 and Q302. A collector of the transistor Q306 is connected to the coupled emitters of the transistors Q303 and Q304. The coupled emitters of the transistors Q305 and Q306 are connected to a constant current sink sinking a constant current $I_0$.

Bases of the transistors Q301 and Q304 are connected to an input terminal T301. Bases of the transistors Q302 and Q303 are connected to another input terminal T302. A first input voltage $V_x$ is applied across the input terminals T301 and T302. A second input voltage $V_y$ is applied across the input terminals T303 and T304.

The third differential pair of the transistors Q305 and Q306 and the constant current sink constitute a differential voltage-current converter 102. A collector current of the transistor Q305 is expressed as $[(I_0/2)+(I_y/2)]$, and a collector current of the transistor Q306 is expressed as $[(I_0/2)-(I_y/2)]$, where $I_y$ is a collector current generated by the input voltage $V_y$.

An output current $I^+$ is derived from the coupled collectors of the transistors Q301 and Q303, and another output current $I^-$ is derived from the coupled collectors of the transistors Q302 and Q304. A differential output current $\Delta I$ of the Gilbert multiplier cell containing the multiplication result is obtained by the difference of the two output currents, i.e., $\Delta I=I^+-I^-$.

The conventional, improved bipolar OTA of FIG. 2 is used as the voltage-current converter 102 in FIG. 3.

When the Gilbert multiplier cell is used as a mixer circuit, in which an input signal and a local signal are applied to the pair of the input terminals T301 and T302 and the pair of the input terminals T303 and T304, respectively, the non-linearity of the input signal tends to cause the third-order distortion in mixer characteristics. Therefore, the linearity of the voltage-current converter 102 needs to be improved.

Additionally, in the Gilbert multiplier cell in FIG. 3, the differential output current $\Delta I$ is expressed as $$\Delta I = I^+ - I^- = I_0[\tan h(V_x/2V_T)\cdot \tan h(V_y/2V_T)].$$

When $V_x \leq V_T$ and $V_y \leq V_T$, the differential output current $\Delta I$ is approximated as $$\Delta I = I_0[(V_x/2V_\tau)\cdot(V_y/2V_T)].$$

An OTA is an essential, basic function block in analog signal applications. Recently, fabrication processes for large-scale integrated circuit devices (LSIs) have been becoming finer and finer and as a result, the supply voltage for the LSIs has been decreasing from 5 V to 3 V, or lower. This tendency has been increasing the necessity for the low-voltage circuit technique more and more.

Also, the above-described conventional OTAs of FIGS. 1 and 2 are capable of low-voltage operation at approximately 3 or 2 V when the input voltage range providing the linear operation is 1 V peak-to-peak (i.e., 1 $V_{P-P}$). However, as described above, they have the problem that the signal-to-noise ratio (S/N) is remarkably degraded and/or that the suitable design of the circuit elements is complicated.

Further, considering that the conventional OTA of FIG. 2 may be used as the voltage-current converter 102 of the Gilbert multiplier cell, they cannot accomplish the necessity for the improved linearity of the voltage-current converter 102.

SUMMARY OF THE INVENTION

Accordingly, an object of the present invention is to provide an OTA in which no S/N degradation occurs due to compression and expansion of a signal.

Another object of the present invention is to provide an OTA capable of low voltage operation at a power supply voltage of approximately 2 V for the input voltage range of approximately 1 V peak-to-peak or greater.

Still another object of the present invention is to provide an OTA capable of linear operation within the entire operable input range of a differential transistor pair.

A further object of the present invention is to provide a multiplier having an improved linearity for at least one of two input signals.

The above objects together with others not specifically mentioned will become clear to those skilled in the art from the following description.

According to a first aspect of the present invention, an OTA is provided, which includes a first differential pair of first and second transistors respectively driven by first and second current sources or sinks.

A first resistor is connected to a signal terminal of the first transistor and a signal terminal of the second transistor.

A differential input signal is applied across a control terminal of the first transistor and a control terminal of the second transistor.

A first current flows through the first transistor and a second current flows the second transistor.

The OTA further includes a second differential pair of third and fourth transistors. A second resistor is connected to a signal terminal of the third transistor and a signal terminal of the fourth transistor.

A third current flows through the third transistor and a fourth current flows the fourth transistor. A fifth current flows through the first resistor in response to the applied differential input signal.

A current path is connected to the signal terminals of the third and fourth transistors, thereby allowing a sixth current to flow through the second resistor.

The third current has a first relationship with the first current to contain a component proportional to the input signal. The fourth current has a second relationship with the second current to contain a component proportional to the input signal.

An output signal is derived from one of the signal terminal of the third transistor and the signal terminal of the fourth transistor.

With the OTA according to the first aspect of the present invention, when the differential input signal is applied across the control terminals of the first and second transistors, the fifth current flows through the first resistor. The fifth current has a current value corresponds to a value of the input signal.

Since the third current has the first relationship with the first current, and the fourth current has the second relationship with the second current, each of the third and fourth currents contains the component proportional to the differential input signal.

As a result, the OTA according to the first aspect of the invention can provide an OTA function without compression nor expansion processes of the input signal, and accordingly, no SIN degradation occurs due to the compression and expansion processes. This means that this OTA can be used for a multiplier having an improved linearity for at least one of two input signals.

Also, the OTA according to the first aspect of the invention operates at a low supply voltage such as approximately 2 V while keeping the input voltage range of approximately 1 V peak-to-peak or greater.

Further, linear operation can be realized within the entire operable input range of the first differential pair.

In a preferred embodiment of the OTA according to the first aspect, a second signal terminal of the first transistor is directly connected to a second signal terminal of the third transistor, and a second signal terminal of the second transistor is directly connected to a second signal terminal of the fourth transistor.

In another preferred embodiment of the OTA according to the first aspect, the third current is supplied by a constant current source and the fourth current is supplied by another constant current source.

In still another preferred embodiment of the OTA according to the first aspect, two additional constant current sources or sinks are further provided. A second signal terminal of the first transistor is directly connected to a second signal terminal of the third transistor, and a second signal terminal of the second transistor is directly connected to a second signal terminal of the fourth transistor. The first and third currents are supplied by one of the additional current sources and the second and fourth currents are supplied by the other of the additional current sources.

Preferably, an output circuit has a level-shifting transistor. In this case, the level-shifting transistor has a function of shifting the dc level of the output current, so that the output current is proportional to the input voltage.

In the OTA according to the first aspect, a bipolar transistor or a MOSFET may be used as each of the first to fourth transistors.

The first and second transistors may be opposite or the same in polarity to the third and fourth transistors.

According to a second aspect of the present invention, a multiplier is provided, which includes the OTA according to the first aspect as a differential voltage-current converter, and two differential pairs of transistors driven by the OTA according to the first aspect.

With the multiplier according to the second aspect, the OTA according to the first aspect contains no S/N degradation due to the compression and expansion processes of the input signal and as a result, this multiplier has an improved linearity for one of two input signals.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
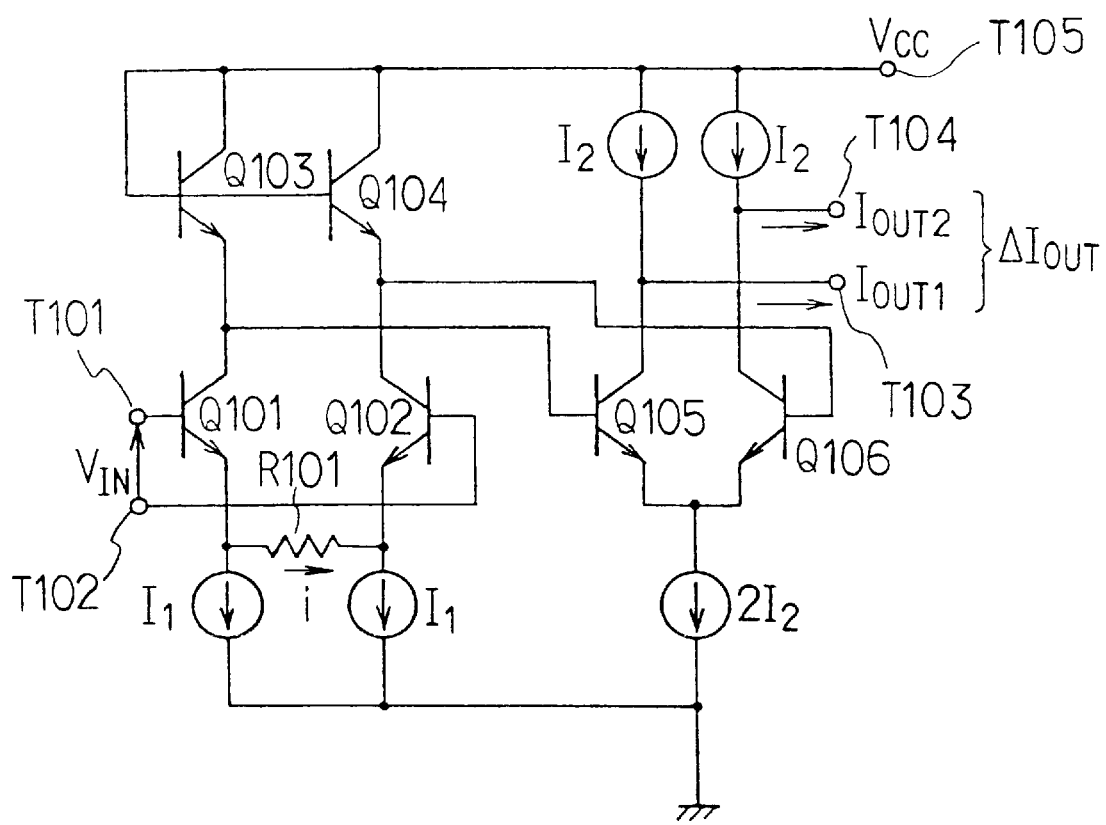
FIG. 1 is a circuit diagram of a conventional bipolar OTA.

Preferred embodiments of the present invention will be described in detail below while referring to the drawings attached.

First Embodiment

Figure 4:
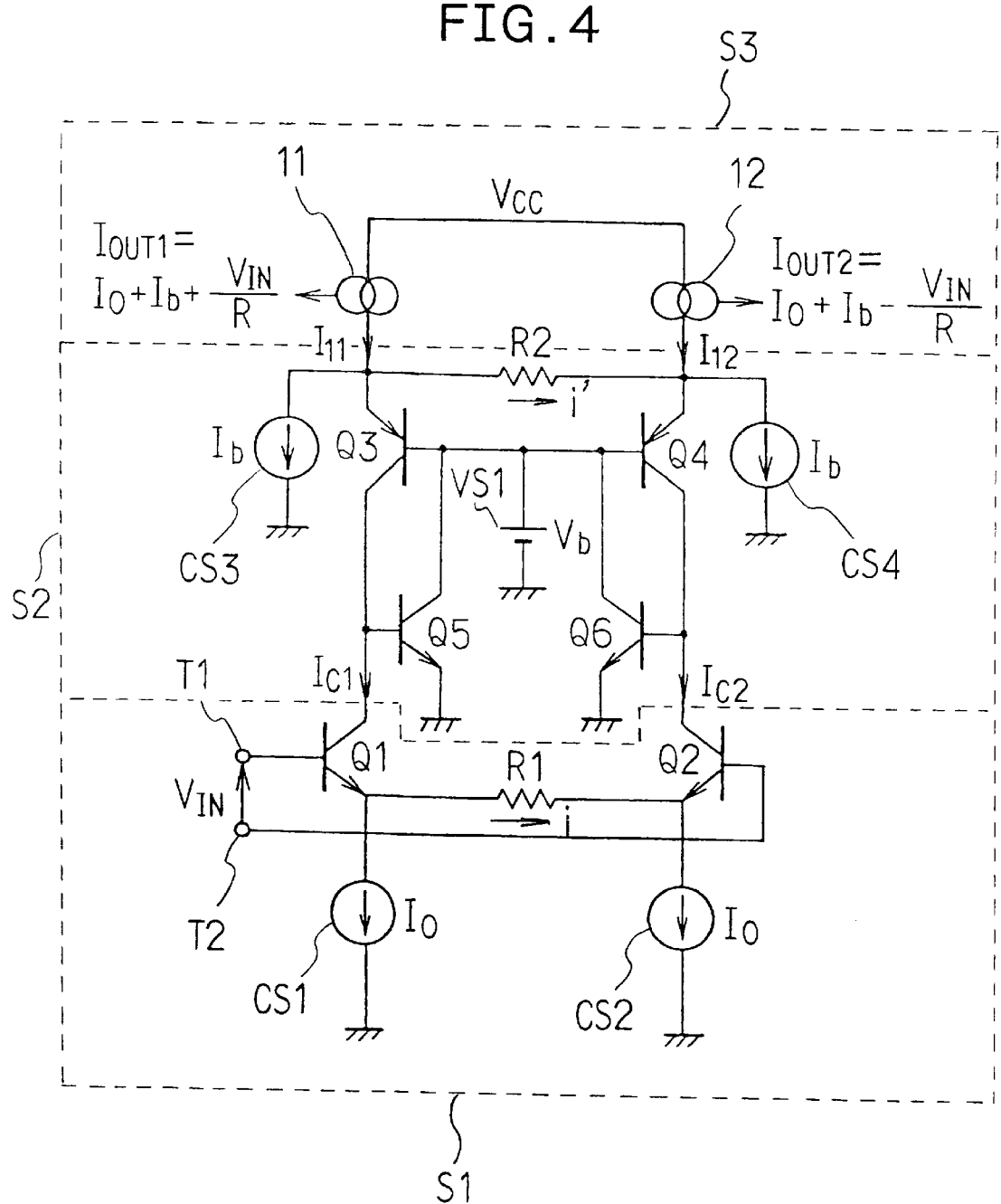
FIG. 4 is a circuit diagram of a bipolar OTA according to a first embodiment of the invention.

A bipolar OTA according to a first embodiment of the present invention is shown in FIG. 4.

As shown in FIG. 4, this OTA includes a first balanced differential pair of npn bipolar transistors Q1 and Q2 whose emitter areas are equal to each other. Emitters of the transistors Q1 and Q2 are coupled together through a first resistor R1 having a resistance R.

The emitter of the transistor Q1 is further connected to one end of a constant current sink CS1 sinking a constant current $I_0$. The other end of the current sink CS1 is grounded. The emitter of the transistor Q2 is connected to one end of a constant current sink CS2 sinking the same constant current $I_0$ as that of the current sink CS1. The other end of the current sink CS2 is grounded. The transistors Q1 and Q2 are driven by the corresponding current sinks CS1 and CS2, respectively.

A base of the transistor Q1 is connected to an input terminal T1 and a base of the transistor Q2 is connected to another input terminal T2. A differential input voltage $V_{IN}$ is applied across the pair of input terminals T1 and T2. A current i will flow through the resistor R1 according to the value of the differential input voltage $V_{IN}$.

This OTA further includes a second balanced differential pair of pnp bipolar transistors Q3 and Q4 whose emitter areas are equal to each other, which are opposite in polarity to the transistors Q1 and Q2. Collectors of the transistors Q3 and Q4 are directly connected to collectors of the transistors Q1 and Q2, respectively.

Bases of the transistors Q3 and Q4 are coupled together to be connected to a positive end of a constant voltage source VS1 supplying a constant bias voltage $V_b$. A negative end of the source VS1 is grounded. Thus, the constant bias voltage $V_b$ is applied to the coupled bases of the transistors Q3 and Q4, respectively.

Emitters of the transistors Q3 and Q4 are coupled together through a second resistor R2 having the same resistance R as that of the first resistor R1.

The emitter of the transistors Q3 is further connected to one end of a constant current sink CS3 sinking a constant current $I_b$. The other end of the current sink CS3 is grounded. The emitter of the transistors Q4 is further connected to one end of a constant current sink CS4 sinking the same constant current $I_b$ as that of the current sink CS3. The other end of the current sink CS4 is grounded.

The two current sinks CS3 and CS4 serve to form a current path, thereby allowing a current i' to flow through the second resistor R2. Also, they enable the current i' having a sufficiently large value to flow through the second resistor R2 even when the absolute value of differential input voltage $V_{IN}$ is very large within the operable input range of the first differential pair of the transistors Q1 and Q2.

To set the voltage at the commonly connected collectors of the transistors Q1 and Q3 a predetermined value, an npn bipolar transistor Q5 is provided. Similarly, to set the voltage at the commonly connected collectors of the transistors Q2 and Q4 a predetermined value, another npn bipolar transistor Q6 is provided.

Emitters of the transistors Q5 and Q6 are grounded. Collectors of the transistors Q5 and Q6 are connected to the coupled bases of the transistors Q3 and Q4, respectively. Bases of the transistors Q5 and Q6 are connected to the coupled collectors of the transistors Q1 and Q3 and those of the transistors Q2 and Q4, respectively.

The emitter of the transistor Q3 is connected to an input end of a current mirror subcircuit 11 serving as a load of the transistor Q3. A power supply end of the subcircuit 11 is connected to a power supply terminal (not shown) to be applied with a power supply voltage $V_{CC}$. The emitter of the transistor Q4 is connected to an input end of a current mirror subcircuit 12 serving as a load of the transistor Q4. A power supply end of the subcircuit 12 is connected to the power supply terminal to be applied with the power supply voltage $V_{CC}$.

An output current $I_{OUT1}$ is derived from an output end of the current mirror subcircuit 11. Another output current $I_{OUT2}$ is derived from an output end the current mirror subcircuit 12.

The first differential pair of the transistors Q1 and Q2 and the first resistor R1 constitutes an input circuit or stage S1. The second differential pair of the transistors Q3 and Q4, and the second resistor R2 constitutes a non-linearity compensation circuit or stage S2. The two current mirror circuits 11 and 12 constitute an output circuit or stage S3.

In the first embodiment, the emitter areas of the first to sixth transistors are equal to each other.

Next, the operation of the bipolar OTA according to the first embodiment is explained below.

Supposing that the common-base current gain factor of each bipolar transistor is approximately equal to unity, a base current of each transistor can be ignored.

In the first differential pair of the transistors Q1 and Q2, when the differential input voltage $V_{IN}$ is applied across the bases of the transistors Q1 and Q2 through the pair of the input terminals T1 and T2, the following equation (9) is established around the loop consisting of the input voltage and the two base-emitter junctions of the transistors Q1 and Q2 because of the Kirchhoff's voltage law $$V_{IN} = V_{BE1} - V_{BE2} + Ri \tag{9}$$

where $V_{BE1}$ and $V_{BE2}$ are the base-to-emitter voltages of the transistors Q1 and Q2, respectively.

From the equation (9), the current i flowing through the first emitter resistor R1 is expressed by the following equation (10).

$$i = \frac{V_{IN} - (V_{BE1} - V_{BE2})}{R} \tag{10}$$

The transistors Q1 and Q2 are opposite in polarity to the transistors Q3 and Q4, and the collectors of the transistors Q1 and Q3 are directly connected to each other and the collectors of the transistors Q2 and Q4 are directly connected to each other between the levels of the supply voltage $V_{CC}$ and the ground. Therefore, a current flowing through the transistor Q1 flows through the transistor Q3; in other words, collector currents of the transistors Q1 and Q3 are the same. Similarly, a current flowing through the transistor Q2 flows through the transistor Q4; in other words, collector currents of the transistors Q2 and Q4 are the same.

Also, since the bases of the transistors Q3 and Q4 are applied with the same bias voltage $V_b$, the base-to-emitter voltage $V_{BE3}$ of the transistor Q3 is equal to the base-to-emitter voltage $V_{BE1}$, and the base-to-emitter voltage $V_{BE4}$ of the transistor Q4 is equal to the base-to-emitter voltage $V_{BE2}$.

As a result, the following equation (11) is established.

$$V_{BE1} - V_{BE2} = V_{BE3} - V_{BE4} \tag{11}$$

Here, the collector currents of the transistors Q1 and Q2 are defined as $I_{C1}$ and $I_{C2}$, and currents flowing at the input ends of the current mirror subcircuits 11 and 12 are defined as $I_{11}$ and $I_{12}$, respectively.

Then, the collector currents $I_{C1}$ and $I_{C2}$ are expressed as follows.

$$I_{C1} = I_0 + i \tag{12}$$

$$I_{C2} = I_0 - i \tag{13}$$

Therefore, the currents $I_{11}$ and $I_{12}$ are expressed as the following equations (14) and (15), respectively.

$$I_{11} = I_b + i' + I_{C1} = I_b + i' + I_0 + i \tag{14}$$

$$I_{12} = I_b - i' + I_{C2} = I_b - i' + I_0 - i \tag{15}$$

On the other hand, the current i' flowing through the second emitter resistor R2 is expressed as $$i' = \frac{V_{BE3} - V_{BE4}}{R} \tag{16}$$

Substituting the equations (10) and (16) into the equations (14) and (15), the currents $I_{11}$ and $I_{12}$ are rewritten to the following equations (17) and (18), respectively.

$$\begin{aligned} I_{11} &= I_0 + I_b + (i + i') \tag{17} \\ &= I_0 + I_b + \left[ \frac{V_{IN} - (V_{BE1} - V_{BE2})}{R} + \frac{V_{BE3} - V_{BE4}}{R} \right] \\ &= I_0 + I_b + \frac{V_{IN}}{R} \end{aligned}$$

$$\begin{aligned} I_{12} &= I_0 + I_b - (i + i') \tag{18} \\ &= I_0 + I_b - \left[ \frac{V_{IN} - (V_{BE1} - V_{BE2})}{R} + \frac{V_{BE3} - V_{BE4}}{R} \right] \\ &= I_0 + I_b - \frac{V_{IN}}{R} \end{aligned}$$

As a result, a differential output current $\Delta I$ of this OTA, which is defined as $I_{11} - I_{12}$, is expressed as $$\Delta I = I_{11} - I_{12} = \frac{2 V_{IN}}{R} \tag{19}$$

It is seen from the equation (19) that the differential output current $\Delta I$ is proportional to the differential input voltage $V_{IN}$. This means that this circuit is capable of an OTA function.

As described above, with the bipolar OTA according to the first embodiment, the differential output current $\Delta I$ is obtained without logarithmic compression or exponential expansion of the input voltage $V_{IN}$. Accordingly, no S/N degradation occurs due to compression and expansion of signals. In other words, this OTA can provide a very high value of S/N.

Also, this bipolar OTA is capable of low voltage operation at the power supply voltage $V_{CC}$ of approximately 1.9 V while keeping the range of the differential input voltage $V_{IN}$ at approximately 1 $V_{p-p}$ or greater.

Further, this OTA is capable of linear operation within the entire operable input range of the first differential pair of the transistors Q1 and Q2.

Second Embodiment

Figure 5:
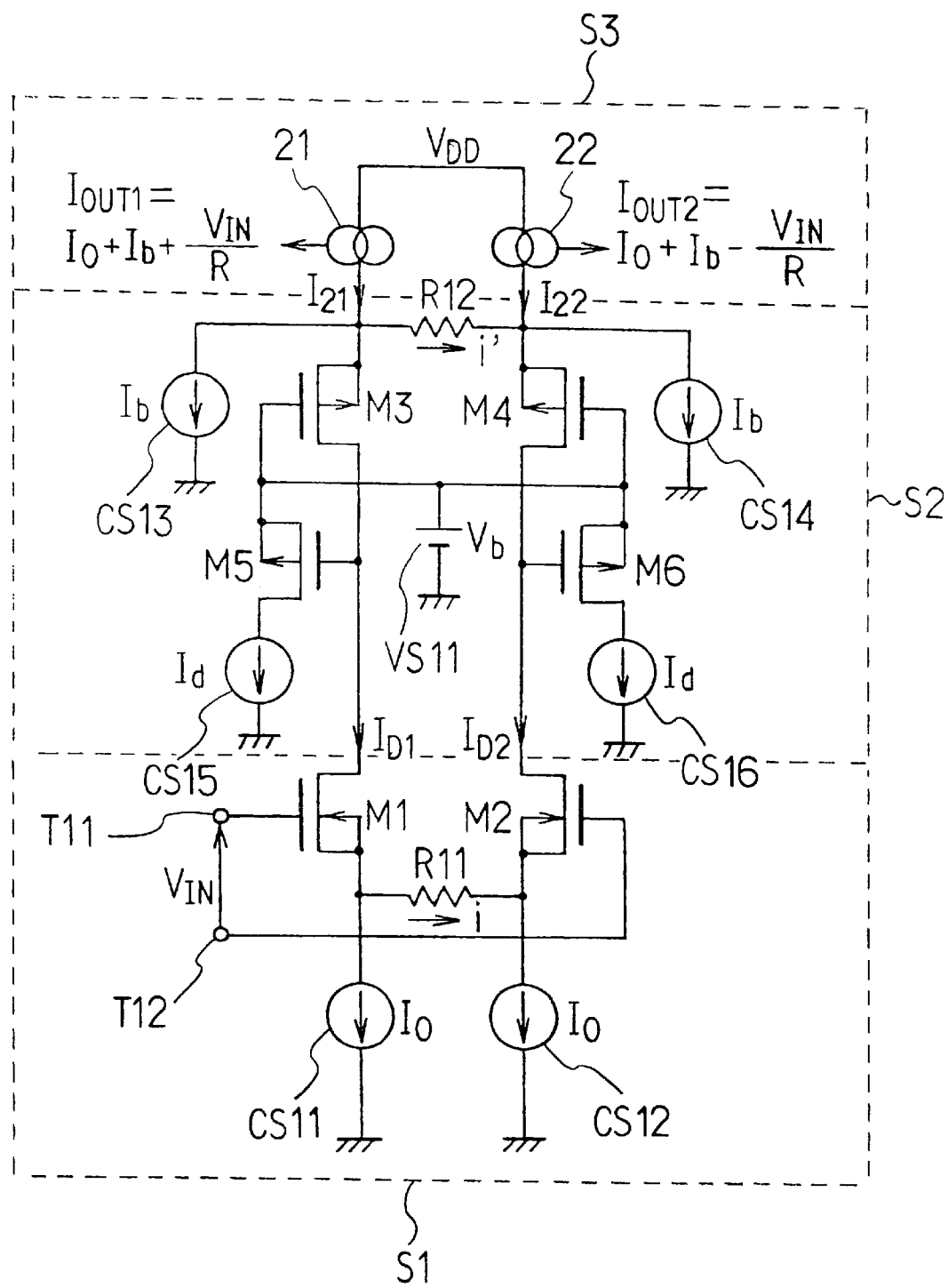
FIG. 5 is a circuit diagram of a MOS OTA according to a second embodiment of the invention, which is equivalent to one obtained by replacing the bipolar transistors with MOSFETs in the OTA of FIG. 4.

A MOS OTA according to a second embodiment of the present invention is shown in FIG. 5, which corresponds to one obtained by replacing each bipolar transistor with an MOSFET.

As shown in FIG. 5, this OTA includes a first balanced differential pair of n-channel MOSFETs M1 and M2 whose transconductance parameters β are equal to each other. Sources of the MOSFETs M1 and M2 are coupled together through a first resistor R11 having a resistance R.

Here, β is defined as $$\beta = \frac{\mu C_{OX}}{2} \cdot \frac{W}{L}$$

where $\mu$ is the mobility of a carrier, $C_{OX}$ is the gate-oxide capacitance per unit area, and W and L are a gate width and a gate length of each MOSFET, respectively.

The source of the MOSFET M1 is further connected to one end of a constant current sink CS11 sinking a constant current $I_0$. The other end of the current sink CS11 is grounded. The source of the MOSFET M2 is connected to one end of a constant current sink CS2 sinking the same constant current $I_0$ as that of the current sink CS1. The other end of the current sink CS2 is grounded. The MOSFETs M1 and M2 are driven by the corresponding current sinks CS11 and CS12, respectively.

A gate of the MOSFET M1 is connected to an input terminal T11 and a gate of the MOSFET M2 is connected to another input terminal T12. A differential input voltage $V_{IN}$ is applied across the pair of input terminals T11 and T12. A current i will flow through the resistor R11 according to the value of the differential input voltage $V_{IN}$.

This OTA further includes a second balanced differential pair of p-channel MOSFETs M3 and M4 whose transconductance parameters β are equal to each other, which are opposite in polarity to the MOSFETs M1 and M2. Drains of the MOSFETs M3 and M4 are directly connected to drains of the MOSFETs M1 and M2, respectively.

Gates of the MOSFETs M3 and M4 are coupled together to be connected to a positive end of a constant voltage source VS11 supplying a constant bias voltage $V_b$. A negative end of the source VS11 is grounded. Thus, the constant bias voltage $V_b$ is applied to the coupled gates of the MOSFETs M3 and M4, respectively.

Sources of the MOSFETs M3 and M4 are coupled together through a second resistor R12 having the same resistance R as that of the first resistor R11.

The source of the MOSFET M3 is further connected to one end of a constant current sink CS13 sinking a constant current $I_b$. The other end of the current sink CS13 is grounded. The source of the MOSFET M4 is further connected to one end of a constant current sink CS14 sinking the same constant current $I_b$ as that of the current sink CS13. The other end of the current sink CS14 is grounded.

The two current sinks CS13 and CS14 serve to form a current path, thereby allowing a current i' to flow through the second resistor R12. Also, they enable the current i' having a sufficiently large value to flow through the second resistor R2 even when the absolute value of differential input voltage $V_{IN}$ is very large within the operable input range of the first differential pair of the MOSFETs M1 and M2.

To set the voltage at the commonly connected drains of the MOSFETs M1 and M3 a predetermined value, a p-channel MOSFET M5 and a constant current sink CS15 sinking a constant current $I_d$ are provided. Similarly, to set the voltage at the commonly connected drains of the MOSFETs M2 and M4 a predetermined value, another p-channel MOSFET M6 and another constant current sink CS16 sinking the same constant current sink $I_b$ as that of the current sink CS15 are provided. The current sinks CS15 and CS16 have a function of allowing the drain currents of the MOSFETs M5 and M6 to flow at a fixed value.

A source of the MOSFET M5 is connected to the coupled gates of the MOSFETs M3 and M4. A gate of the MOSFET M5 is connected to the coupled drains of the MOSFETs M1 and M3. A drain of the MOSFET M5 is connected to one end of the constant current sink CS15. The other end of the current sink CS15 is grounded.

Similarly, a source of the MOSFET M6 is connected to the coupled gates of the MOSFETs M3 and M4. A gate of the MOSFET M6 is connected to the coupled drains of the MOSFETs M2 and M4. A drain of the MOSFET M6 is connected to one end of the constant current sink CS16. The other end of the current sink CS16 is grounded.

The source of the MOSFET M3 is connected to an input end of a current mirror subcircuit 21 serving as a load of the MOSFET M3. A power supply end of the subcircuit 21 is connected to a power supply terminal (not shown) to be applied with a power supply voltage $V_{DD}$. The source of the MOSFET M4 is connected to an input end of a current mirror subcircuit 22 serving as a load of the MOSFET M4. A power supply end of the subcircuit 22 is connected to the power supply terminal to be applied with the power supply voltage $V_{DD}$.

An output current $I_{OUT}$ is derived from an output end of the current mirror subcircuit 21. Another output current $I_{OUT2}$ is derived from an output end of the current mirror subcircuit 22.

The first differential pair of the MOSFETs M1 and M2 and the first resistor R11 constitutes an input circuit or stage S1. The second differential pair of the MOSFETs M3 and M4, and the second resistor R12 constitutes a non-linearity compensation circuit or stage S2. The two current mirror circuits 21 and 22 constitute an output circuit or stage S3.

In the second embodiment, the transconductance parameters β of the first to sixth MOSFETs are equal to each other.

Next, the operation of the MOS OTA according to the second embodiment is explained below.

In the first differential pair of the MOSFETs M1 and M2, when the differential input voltage $V_{IN}$ is applied across the gates of the MOSFETs M1 and M2 through the pair of the input terminals T11 and T12, the following equation (20) is established around the loop consisting of the input voltage and the two gate-source junctions of the MOSFETs M1 and M2 because of the Kirchhoff's voltage law $$V_{IN} = V_{GS1} - V_{GS2} + Ri \quad (20)$$

where $V_{GS1}$ and $V_{GS2}$ are the gate-to-source voltages of the MOSFETs M1 and M2, respectively.

From the equation (20), the current i flowing through the first source resistor R11 is expressed by the following equation (21).

$$i = \frac{V_{IN} - (V_{GS1} - V_{GS2})}{R} \quad (21)$$

The MOSFETs M1 and M2 are opposite in polarity to the MOSFETs M3 and M4, and the drains of the MOSFETs M1 and M3 are directly connected to each other and the drains of the MOSFETs M2 and M4 are connected to each other between the levels of the supply voltage $V_{CC}$ and the ground. Therefore, a current flowing through the MOSFET M1 flows through the MOSFET M3; in other words, drain currents of the MOSFETs M1 and M3 are the same. Similarly, a current flowing through the MOSFET M2 flows through the MOSFET M4; in other words, drain currents of the MOSFETs M2 and M4 are the same.

Also, since the gates of the MOSFETs M3 and M4 are applied with the same bias voltage $V_b$, the gate-to-source voltage $V_{GS3}$ of the MOSFET M3 is equal to the gate-to-source voltage $V_{GS1}$, and the gate-to-source voltage $V_{GS4}$ of the MOSFET M4 is equal to the gate-to-source voltage $V_{GS2}$.

As a result, the following equation (22) is established.

$$V_{GS1} - V_{GS2} = V_{GS3} - V_{GS4} \quad (22)$$

Here, the drain currents of the MOSFETs M1 and M2 are defined as $I_{D1}$ and $I_{D2}$, and currents flowing at the input ends of the current mirror subcircuits 21 and 22 are defined as $I_{21}$ and $I_{22}$, respectively.

Then, the drain currents $I_{D1}$ and $I_{D2}$ are expressed as follows.

$$I_{D1} = I_0 + i \tag{23}$$

$$I_{D2} = I_0 - i \tag{24}$$

Therefore, the currents $I_{21}$ and $I_{22}$ are expressed as the following equations (25) and (26), respectively.

$$I_{21} = I_b + i' + I_{D1} = I_b + i' + I_0 + i \tag{25}$$

$$I_{22} = I_b - i' + I_{D2} = I_b - i' + I_0 - i \tag{26}$$

On the other hand, the current i' flowing through the second source resistor R12 is expressed as $$i' = \frac{V_{BE3} - V_{BE4}}{R} \tag{27}$$

Substituting the equations (21) and (27) into the equations (25) and (26), the currents $I_{21}$ and $I_{22}$ are rewritten to the following equations (28) and (29), respectively.

$$\begin{aligned}
I_{21} &= I_0 + I_b + (i + i') & (28)\\
&= I_0 + I_b + \left[ \frac{V_{IN} - (V_{GS1} - V_{GS2})}{R} + \frac{V_{GS3} - V_{GS4}}{R} \right] \\
&= I_0 + I_b + \frac{V_{IN}}{R} \\
I_{21} &= I_0 + I_b - (i + i') & (29)\\
&= I_0 + I_b - \left[ \frac{V_{IN} - (V_{GS1} - V_{GS2})}{R} + \frac{V_{GS3} - V_{GS4}}{R} \right] \\
&= I_0 + I_b - \frac{V_{IN}}{R}
\end{aligned}$$

As a result, a differential output current $\Delta I$ of this OTA, which is defined as $I_{21} - I_{22}$, is expressed as $$\Delta I = I_{21} - I_{22} = \frac{2V_{IN}}{R} \tag{30}$$

It is seen from the equation (30) that the differential output current $\Delta I$ is proportional to the differential input voltage $V_{IN}$. This means that this circuit is capable of an OTA function.

As described above, with the MOS OTA according to the second embodiment, the differential output current $\Delta I$ is obtained without logarithmic compression or exponential expansion of the input voltage $V_{IN}$. Accordingly, no S/N degradation occurs due to compression and expansion of signals. In other words, this OTA can provide a very high value of S/N.

Also, this MOS OTA is capable of low voltage operation at the power supply voltage $V_{CC}$ of approximately 1.9 V while keeping the range of the differential input voltage $V_{IN}$ at approximately 1 $V_{p-p}$ or greater.

Further, this OTA is capable of linear operation within the entire operable input range of the first differential pair of the MOSFETs M1 and M2.

Third Embodiment

Figure 6:
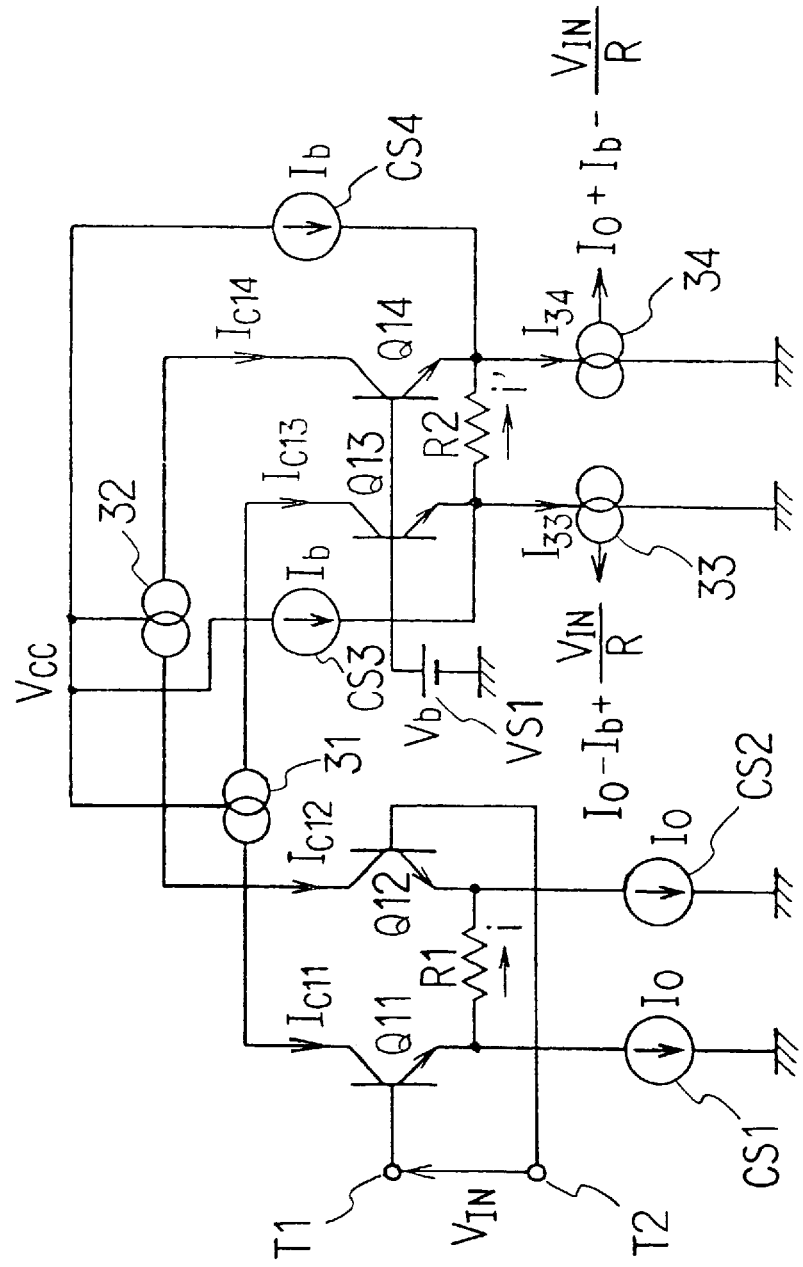
FIG. 6 is a circuit diagram of a bipolar OTA according to a third embodiment of the invention.

A bipolar OTA according to a third embodiment of the present invention is shown in FIG. 6, which corresponds to one obtained by replacing the pnp bipolar transistors Q3 and Q4 in the first embodiment of FIG. 4 with npn bipolar transistors respectively.

As shown in FIG. 6, this OTA includes a first balanced differential pair of npn bipolar transistors Q11 and Q12 whose emitter areas are equal to each other. Emitters of the transistors Q11 and Q12 are coupled together through a first resistor R1 having a resistance R.

The emitter of the transistor Q11 is further connected to one end of a first constant current sink CS1 sinking a constant current $I_0$. The other end of the first current sink CS1 is grounded. The emitter of the transistor Q12 is connected to one end of a second constant current sink CS2 sinking the same constant current $I_0$ as that of the first current sink CS1. The other end of the second current sink CS2 is grounded. The transistors Q11 and Q12 are driven by the corresponding current sinks CS1 and CS2, respectively.

A base of the transistor Q11 is connected to an input terminal T1 and a base of the transistor Q12 is connected to another input terminal T2. A differential input voltage $V_{IN}$ is applied across the pair of input terminals T1 and T2. A current i will flow through the resistor R1 according to the value of the differential input voltage $V_{IN}$.

This first differential pair is the same in configuration as that of the first embodiment of FIG. 4. However, the former is different from the latter in the collector connection of the transistors Q11 and Q12.

Specifically, a collector of the transistor Q11 is connected to an input end of a first current mirror subcircuit 31. A power supply end of the subcircuit 31 is connected to a power supply terminal (not shown) to be applied with a power supply voltage $V_{CC}$. The collector of the transistor Q12 is connected to an input end of a second current mirror subcircuit 32. A power supply end of the subcircuit 32 is connected to the power supply terminal to be applied with the power supply voltage $V_{CC}$.

This OTA further includes a second differential pair of npn bipolar transistors Q13 and Q14, which are the same in polarity as the transistors Q11 and Q12.

A collector of the transistor Q13 is connected to an output end of the first current mirror subcircuit 31. A collector of the transistor Q14 is connected to an output end of the second current mirror subcircuit 32.

Bases of the transistors Q13 and Q14 are coupled together to be connected to a positive end of a constant voltage source VS1 supplying a constant bias voltage $V_b$. A negative end of the source VS1 is grounded. Thus, the constant bias voltage $V_b$ is applied to the coupled bases of the transistors Q13 and Q14, respectively.

Emitters of the transistors Q13 and Q14 are coupled together through a second resistor R2 having the same resistance R as that of the first resistor R1.

The emitter of the transistors Q13 is further connected to one end of a constant current source CS3 supplying a constant current $I_b$. The other end of the current source CS3 is connected to the power supply terminal to be applied with the supply voltage $V_{CC}$. The emitter of the transistors Q14 is further connected to one end of a constant current source CS4 supplying the same constant current $I_b$ as that of the current source CS3. The other end of the current source CS4 is connected to the power supply terminal to be applied with the supply voltage $V_{CC}$.

The two current sources CS3 and CS4 serve to form a current path, thereby allowing a current i' to flow through the second resistor R2.

The emitter of the transistor Q13 is connected to an input end of a current mirror subcircuit 33 serving as a load of the transistor Q13. A ground end of the subcircuit 11 is grounded. The emitter of the transistor Q14 is connected to an input end of a current mirror subcircuit 34 serving as a load of the transistor Q14. A ground end of the subcircuit 34 is grounded.

An output current $I_{OUT1}$ is derived from an output end of the current mirror subcircuit 33. Another output current $I_{OUT2}$ is derived from an output end the current mirror subcircuit 34.

The first differential pair of the transistors Q11 and Q12 and the first resistor R1 constitutes an input circuit or stage S1. The second differential pair of the transistors Q13 and Q14, and the second resistor R2 constitutes a non-linearity compensation circuit or stage S2. The two current mirror circuits 33 and 34 constitute an output circuit or stage S3.

In the third embodiment, the emitter areas of the first to fourth transistors are equal to each other.

Next, the operation of the bipolar OTA according to the third embodiment is explained below.

In this OTA, it is clear that the following equation (31) and (32) are established.

$$V_{IN} = V_{BE11} - V_{BE12} + Ri \tag{31}$$

$$i = \frac{V_{IN} - (V_{BE11} - V_{BE12})}{R} \tag{32}$$

where $V_{BE11}$ and $V_{BE12}$ are the base-to-emitter voltages of the transistors Q11 and Q12, respectively.

Further, the second differential pair is composed of the npn transistors Q13 and Q14 which are the same in polarity as that of the first embodiment, and the current mirror circuits 31 and 32 are provided for supplying mirror currents of currents flowing through the transistors Q11 and Q12 to the corresponding transistors Q13 and Q14, respectively. Therefore, a collector current $I_{C13}$ of the transistor Q13 is equal to a collector current $I_{C11}$ of the transistor Q11, and a collector current $I_{C14}$ of the transistor Q14 is equal to a collector current $I_{C12}$ of the transistor Q12; i.e., $I_{C13}=I_{C11}$ and $I_{C14}=I_{C12}$. This is the same as that in the first embodiment.

As a result, the following equation (33) is established $$V_{BE11} - V_{BE12} = V_{BE13} - V_{BE14} \tag{33}$$

where $V_{BE13}$ and $V_{BE14}$ are the base-to-emitter voltages of the transistors Q13 and Q14, respectively.

The collector currents $I_{C11}$, $I_{C12}$, $I_{C13}$ and $I_{C14}$ are expressed as follows.

$$I_{C11} = I_{C13} = I_0 + i \tag{34}$$

$$I_{C12} = I_{C14} = I_0 - i \tag{35}$$

If currents flowing at the input ends of the current mirror subcircuits 33 and 34 are defined as $I_{33}$ and $I_{34}$, $I_{33}$ and $I_{34}$ are expressed as the following equations (36) and (37), respectively.

$$I_{33} = I_b - i' + I_{C13} = I_b - i' + I_0 + i \tag{36}$$

$$I_{34} = I_b + i' + I_{C14} = I_b + i' + I_0 - i \tag{37}$$

On the other hand, the current i' flowing through the second emitter resistor R2 is expressed as $$i' = \frac{V_{BE13} - V_{BE14}}{R} \tag{38}$$

Substituting the equations (32) and (38) into the equations (36) and (37), the currents $I_{33}$ and $I_{34}$ are rewritten to the following equations (39) and (40), respectively.

$$\begin{aligned}
I_{33} &= I_0 - I_b + (i + i') \\
&= I_0 - I_b + \left[ \frac{V_{IN} - (V_{BE11} - V_{BE12})}{R} + \frac{V_{BE13} - V_{BE14}}{R} \right] \\
&= I_0 - I_b + \frac{V_{IN}}{R}
\end{aligned} \tag{39}$$

$$\begin{aligned}
I_{34} &= I_0 + I_b - (i + i') \\
&= I_0 + I_b - \left[ \frac{V_{IN} - (V_{BE11} - V_{BE12})}{R} + \frac{V_{BE13} - V_{BE14}}{R} \right] \\
&= I_0 + I_b - \frac{V_{IN}}{R}
\end{aligned} \tag{40}$$

As a result, a differential output current $\Delta I$ of this OTA, which is defined as $(I_{33} - I_{34})$, is expressed as $$\Delta I = I_{33} - I_{34} = \frac{2 V_{IN}}{R} \tag{41}$$

It is seen from the equation (41) that the differential output current $\Delta I$ is proportional to the differential input voltage $V_{IN}$. This means that this circuit is capable of an OTA function.

As described above, the bipolar OTA according to the third embodiment has the same advantages or effects as those of the first embodiment.

Fourth Embodiment

Figure 7:
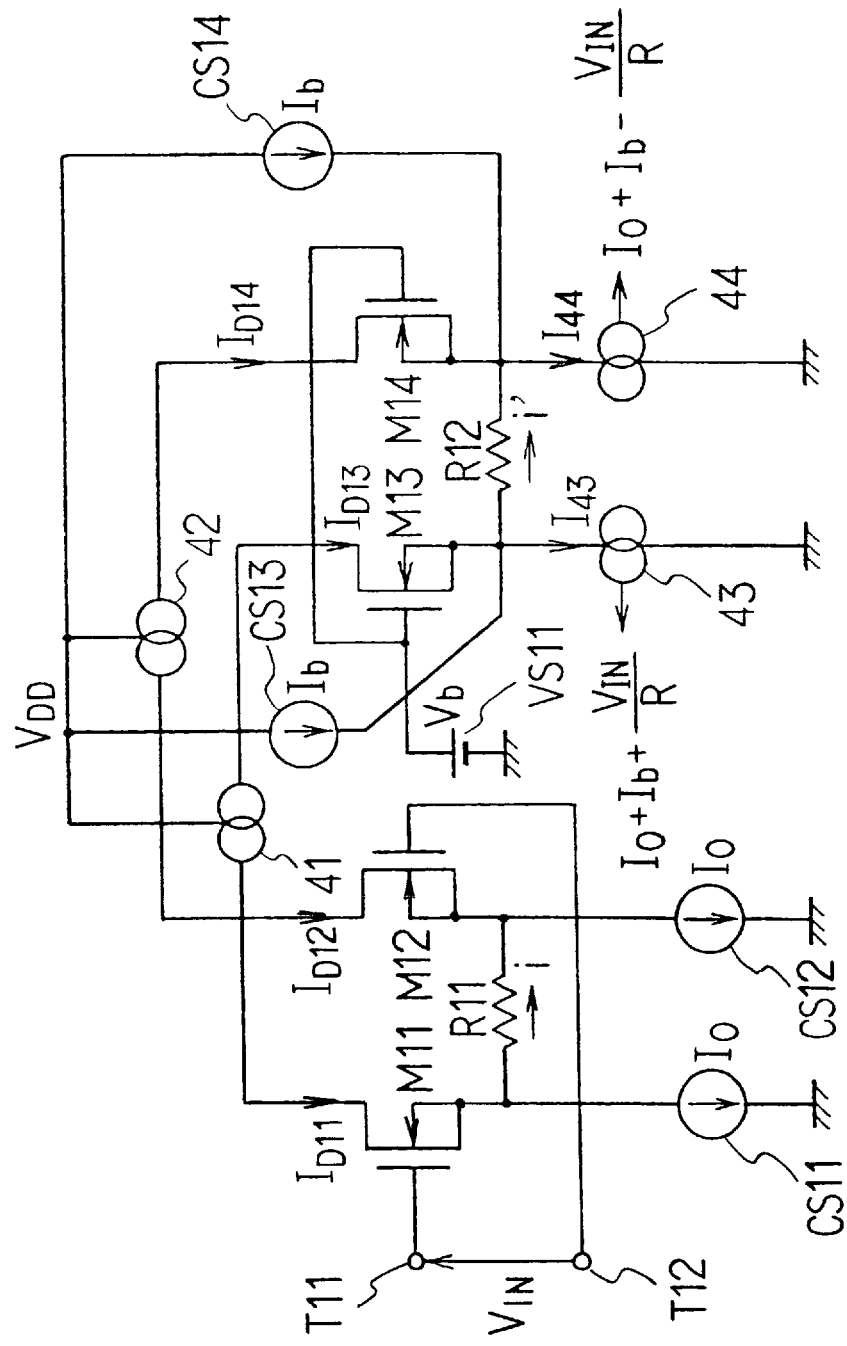
FIG. 7 is a circuit diagram of a MOS OTA according to a fourth embodiment of the invention, which is equivalent to one obtained by replacing the bipolar transistors with MOSFETs in the OTA of FIG. 6.

A MOS OTA according to a fourth embodiment of the present invention is shown in FIG. 7, which corresponds to one obtained by replacing the p-channel MOSFETs M3 and M4 in the second embodiment of FIG. 5 with n-channel MOSFETs, respectively.

As shown in FIG. 7, this OTA includes a first balanced differential pair of n-channel MOSFETs M11 and M12 whose transconductance parameters β are equal to each other. Sources of the MOSFETs M11 and M12 are coupled together through a first resistor R1 having a resistance R.

The source of the MOSFET M11 is further connected to one end of a constant current sink CS11 sinking a constant current $I_0$. The other end of the first current sink CS11 is grounded. The source of the MOSFET M12 is connected to one end of a constant current sink CS12 sinking the same constant current $I_0$ as that of the current sink CS1. The other end of the current sink CS12 is grounded. The MOSFETs M1 and M2 are driven by the corresponding current sinks CS11 and CS12, respectively.

A gate of the MOSFET M11 is connected to an input terminal T11 and a gate of the MOSFET M12 is connected to another input terminal T12. A differential input voltage $V_{IN}$ is applied across the pair of input terminals T11 and T12. A current i will flow through the resistor R1 according to the value of the differential input voltage $V_{IN}$.

This first differential pair is the same in configuration as that of the second embodiment of FIG. 5. However, the former is different from the latter in the drain connection of the MOSFETs M11 and M12.

Specifically, a drain of the MOSFET M11 is connected to an input end of a current mirror subcircuit 41. A power supply end of the subcircuit 41 is connected to a power supply terminal (not shown) to be applied with a power supply voltage $V_{DD}$. The drain of the MOSFET M12 is connected to an input end of a current mirror subcircuit 42. A power supply end of the subcircuit 42 is connected to the power supply terminal to be applied with the power supply voltage $V_{DD}$.

This OTA further includes a second differential pair of n-channel MOSFETs M13 and M14, which are the same in polarity as the MOSFETs M11 and MQ12.

A drain of the MOSFET M13 is connected to an output end of the current mirror subcircuit 41. A drain of the MOSFET M14 is connected to an output end of the current mirror subcircuit 42.

Gates of the MOSFETs M13 and M14 are coupled together to be connected to a positive end of a constant voltage source VS11 supplying a constant bias voltage $V_b$. A negative end of the source VS1 is grounded. Thus, the constant bias voltage $V_b$ is applied to the coupled gates of the MOSFETs M13 and M14, respectively.

Sources of the MOSFETs M13 and M14 are coupled together through a second resistor R2 having the same resistance R as that of the first resistor R1. The source of the MOSFET M13 is further connected to one end of a constant current source CS13 supplying a constant current $I_b$. The other end of the current source CS13 is connected to the power supply terminal to be applied with the supply voltage $V_{DD}$. The source of the MOSFET M14 is further connected to one end of a constant current source CS14 supplying the same constant current $I_b$ as that of the current source CS13. The other end of the current source CS14 is connected to the power supply terminal to be applied with the supply voltage $V_{DD}$.

The two current sources CS13 and CS14 serve to form a current path, thereby allowing a current i' to flow through the second resistor R2.

The source of the MOSFET M13 is connected to an input end of a current mirror subcircuit 43 serving as a load of the MOSFET M13. A ground end of the subcircuit 43 is grounded. The source of the MOSFET M14 is connected to an input end of a current mirror subcircuit 44 serving as a load of the MOSFET M14. A ground end of the subcircuit 44 is grounded.

An output current $I_{OUT1}$ is derived from an output end of the current mirror subcircuit 43. Another output current $I_{OUT2}$ is derived from an output end the current mirror subcircuit 44.

The first differential pair of the MOSFETs M11 and M12 and the first resistor R11 constitutes an input circuit or stage S1. The second differential pair of the MOSFETs M13 and M14, and the second resistor R12 constitutes a non-linearity compensation circuit or stage S2. The two current mirror circuits 43 and 44 constitute an output circuit or stage S3.

In the fourth embodiment, the transconductance parameters β of the first to fourth MOSFETs are equal to each other.

Next, the operation of the MOS OTA according to the fourth embodiment is explained below.

In this OTA, it is clear that the following equation (42) and (43) are established.

$$V_{IN} = V_{GS11} - V_{GS12} + Ri \quad (42)$$

$$i = \frac{V_{IN} - (V_{GS11} - V_{GS12})}{R} \quad (43)$$

where $V_{GS11}$ and $V_{GS12}$ are the gate-to-source voltages of the MOSFETs M11 and M12, respectively.

Further, the second differential pair is composed of the n-channel MOSFETs M13 and M14 which are the same in polarity as that of the second embodiment, and the current mirror circuits 41 and 42 are provided for supplying mirror currents of currents flowing through the MOSFETs M11 and M12 to the corresponding MOSFETs M13 and M14, respectively. Therefore, a drain current $I_{D13}$ of the MOSFETs M13 is equal to a drain current $I_{D11}$ of the MOSFET M11, and a drain current $I_{D14}$ of the MOSFET M14 is equal to a drain current $I_{D12}$ of the MOSFET M12; i.e., $I_{D13}=I_{D11}$ and $I_{D14}=I_{D12}$. This is the same as that in the second embodiment.

As a result, the following equation (44) is established $$V_{GS11} - V_{GS12} = V_{GS13} - V_{GS14} \quad (44)$$

where $V_{GS13}$ and $V_{GS14}$ are the gate-to-source voltages of the MOSFETs M13 and M14, respectively.

The drain currents $I_{D11}$, $I_{D12}$, $I_{D13}$ and $I_{D14}$ are expressed as follows.

$$I_{D11} = I_{D13} = I_0 + i \quad (45)$$

$$I_{D12} = I_{D14} = I_0 - i \quad (46)$$

Currents flowing at the input ends of the current mirror subcircuits 43 and 44 are defined as $I_{43}$ and $I_{44}$, $I_{43}$ and $I_{44}$ are expressed as the following equations (47) and (48), respectively.

$$I_{43} = I_b - i' + I_{D13} = I_b - i' + I_0 + i \quad (47)$$

$$I_{44} = I_b + i' + I_{D14} = I_b + i' + I_0 - i \quad (48)$$

On the other hand, the current i' flowing through the second emitter resistor R2 is expressed as $$i' = \frac{V_{GS13} - V_{GS14}}{R} \quad (49)$$

Substituting the equations (43) and (49) into the equations (47) and (48), the currents $I_{43}$ and $I_{44}$ are rewritten to the following equations (50) and (51), respectively.

$$\begin{aligned} I_{43} &= I_0 + I_b + (i - i') \\ &= I_0 + I_b + \left[ \frac{V_{IN} - (V_{GS11} - V_{GS12})}{R} - \frac{V_{GS13} - V_{GS14}}{R} \right] \\ &= I_0 + I_b + \frac{V_{IN}}{R} \end{aligned} \quad (50)$$

$$\begin{aligned} I_{44} &= I_0 + I_b - (i - i') \\ &= I_0 + I_b - \left[ \frac{V_{IN} - (V_{GS11} - V_{GS12})}{R} - \frac{V_{GS13} - V_{GS14}}{R} \right] \\ &= I_0 + I_b - \frac{V_{IN}}{R} \end{aligned} \quad (51)$$

As a result, a differential output current ΔI of this OTA, which is defined as $(I_{43}-I_{44})$, is expressed as $$\Delta I = I_{43} - I_{44} = \frac{2V_{IN}}{R} \quad (52)$$

It is seen from the equation (52) that the differential output current ΔI is proportional to the differential input voltage $V_{IN}$. This means that this circuit is capable of an OTA function.

As described above, the MOS OTA according to the fourth embodiment has the same advantages or effects as those of the second embodiment.

Fifth Embodiment

Figure 8:
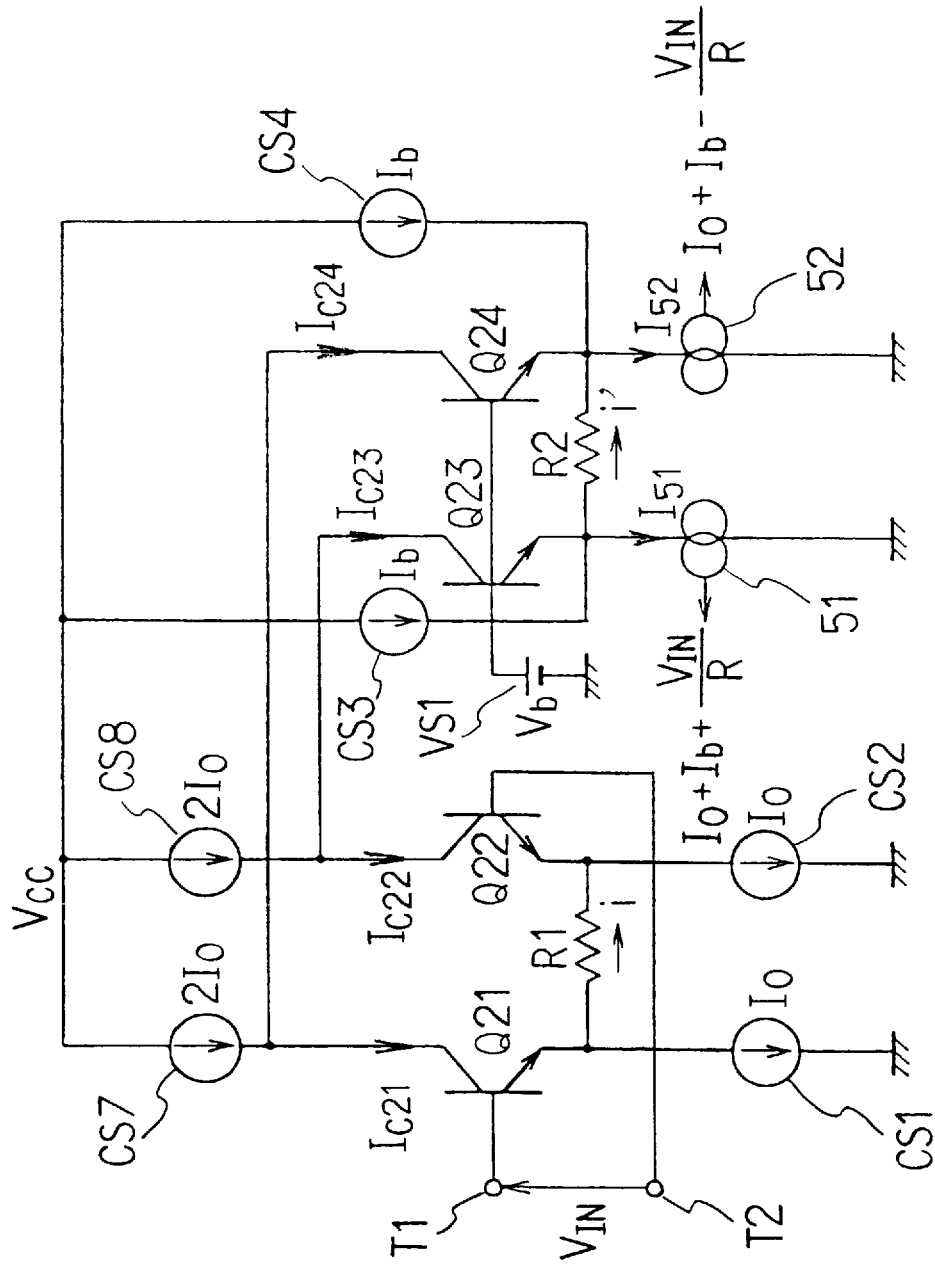
FIG. 8 is a circuit diagram of a bipolar OTA according to a fifth embodiment of the invention.

A bipolar OTA according to a fifth embodiment of the present invention is shown in FIG. 8, which corresponds to one obtained by replacing the pnp bipolar transistors Q3 and Q4 in the first embodiment of FIG. 4 with npn bipolar transistors, respectively.

As shown in FIG. 8, this OTA includes a first balanced differential pair of npn bipolar transistors Q21 and Q22 whose emitter areas are equal to each other. Emitters of the transistors Q21 and Q22 are coupled together through a first resistor R1 having a resistance R.

The emitter of the transistor Q21 is further connected to one end of a constant current sink CS1 sinking a constant current $I_0$. The other end of the current sink CS1 is grounded. The emitter of the transistor Q22 is connected to one end of a constant current sink CS2 sinking the same constant current $I_0$ as that of the current sink CS1. The other end of the current sink CS2 is grounded. The transistors Q21 and Q22 are driven by the corresponding current sinks CS1 and CS2, respectively.

A base of the transistor Q21 is connected to an input terminal T1 and a base of the transistor Q22 is connected to another input terminal T2. A differential input voltage $V_{IN}$ is applied across the pair of input terminals T1 and T2. A current i will flow through the resistor R1 according to the value of the differential input voltage $V_{IN}$.

This first differential pair is the same in configuration as that of the first embodiment of FIG. 4. However, the former is different from the latter in the collector connection of the transistors Q21 and Q22.

Specifically, a collector of the transistor Q21 is directly connected to one end of a constant current source CS7 supplying a constant current $2I_0$. The other end of the source CS7 is connected to a power supply terminal (not shown) to be applied with a power supply voltage $V_{CC}$. The collector of the transistor Q22 is directly connected to an input end of a constant current source CS8 supplying the same constant current $2I_0$ as that of the current source CS7. The other end of the current source CS8 is connected to the power supply terminal to be applied with the power supply voltage $V_{CC}$.

This OTA further includes a second differential pair of npn bipolar transistors Q23 and Q24, which are the same in polarity as the transistors Q21 and Q22.

A collector of the transistor Q23 is directly connected to the collector of the transistor Q22. A collector of the transistor Q24 is directly connected to a collector of the transistor Q21.

Bases of the transistors Q23 and Q24 are coupled together to be connected to a positive end of a constant voltage source VS1 supplying a constant bias voltage $V_b$. A negative end of the source VS1 is grounded. Thus, the constant bias voltage $V_b$ is applied to the coupled bases of the transistors Q23 and Q24, respectively.

Emitters of the transistors Q23 and Q24 are coupled together through a second resistor R2 having the same resistance R as that of the first resistor R1.

The emitter of the transistors Q23 is further connected to one end of a constant current source CS3 supplying a constant current $I_b$. The other end of the current source CS3 is connected to the power supply terminal to be applied with the supply voltage $V_{CC}$. The emitter of the transistors Q24 is further connected to one end of a constant current source CS4 supplying the same constant current $I_b$ as that of the current source CS3. The other end of the current source CS4 is connected to the power supply terminal to be applied with the supply voltage $V_{CC}$.

The two current sources CS3 and CS4 serve to form a current path, thereby allowing a current i' to flow through the second resistor R2.

The emitter of the transistor Q23 is connected to an input end of a current mirror subcircuit 51 serving as a load of the transistor Q23. A ground end of the subcircuit 51 is grounded. The emitter of the transistor Q24 is connected to an input end of a current mirror subcircuit 52 serving as a load of the transistor Q24. A ground end of the subcircuit 52 is grounded.

An output current $I_{OUT1}$ is derived from an output end of the current mirror subcircuit 51. Another output current $I_{OUT2}$ is derived from an output end the current mirror subcircuit 52.

The first differential pair of the transistors Q21 and Q22 and the first resistor R1 constitutes an input circuit or stage S1. The second differential pair of the transistors Q23 and Q24, and the second resistor R2 constitutes a non-linearity compensation circuit or stage S2. The two current mirror circuits 51 and 52 constitute an output circuit or stage S3.

In the fifth embodiment, the emitter areas of the first to fourth transistors are equal to each other.

Next, the operation of the bipolar OTA according to the fifth embodiment is explained below.

In this OTA, it is clear that the following equation (53), (54), (55) and (56) are established.

$$V_{IN} = V_{BE21} - V_{BE22} + Ri \tag{53}$$

$$i = \frac{V_{IN} - (V_{BE21} - V_{BE22})}{R} \tag{54}$$

$$I_{C21} = I_o + i \tag{55}$$

$$I_{C22} = I_o - i \tag{56}$$

where $V_{BE21}$ and $V_{BE22}$ are the base-to-emitter voltages of the transistors Q21 and Q22, and $I_{C21}$ and $I_{C22}$ are collector currents thereof, respectively.

Figure 2:
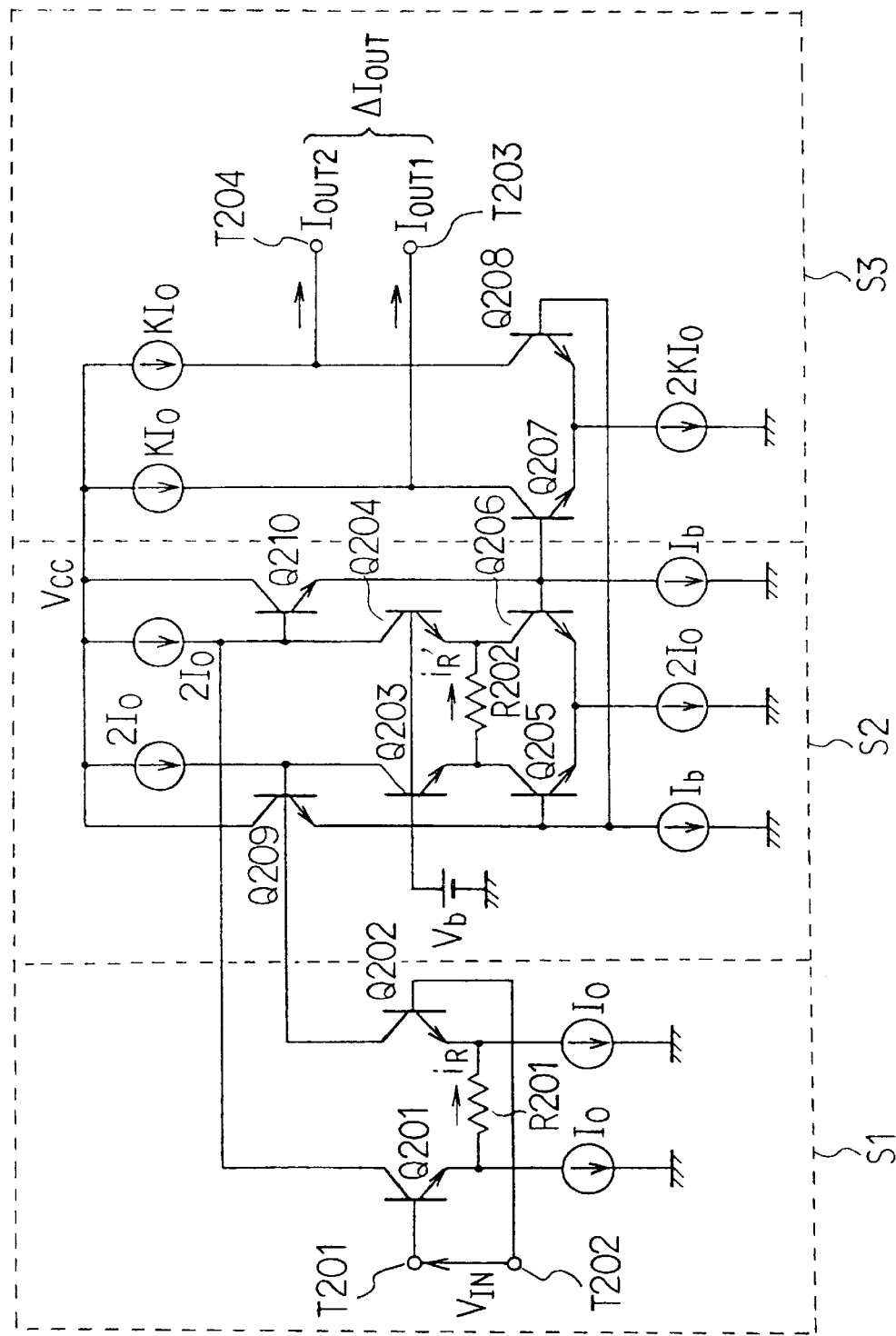
FIG. 2 is a circuit diagram of another conventional bipolar OTA, which improves the linearity of the conventional OTA of FIG. 1.

Further, the second differential pair is composed of the npn transistors Q23 and Q24 which are the same in polarity as that of the first differential pair. The constant current sources CS7 and CS8 each supplying the constant currents of $2I_0$ are provided for the transistors Q23 and Q24, respectively, which is in the same way as that in the conventional OTA of FIG. 2.

Therefore, the collector currents $I_{C23}$ and $I_{C24}$ are expressed as $$I_{C23} = 2I_0 - I_{C22} = I_0 - i \tag{57}$$

$$I_{C24} = 2I_0 - I_{C21} = I_0 + i \tag{58}$$

Currents flowing at the input ends of the current mirror subcircuits 51 and 52 are defined as $I_{51}$ and $I_{52}$, $I_{51}$ and $I_{52}$ are expressed as the follows.

$$I_{51} = I_b - i' + I_{C23} = I_b - i' + I_0 + i \tag{59}$$

$$I_{52} = I_b + i' + I_{C24} = I_b + i' + I_0 - i \tag{60}$$

On the other hand, the current i' flowing through the second emitter resistor R2 is expressed as $$i' = \frac{V_{BE23} - V_{BE24}}{R} \tag{61}$$

Substituting the equations (54) and (61) into the equations (59) and (60), the currents $I_{51}$ and $I_{52}$ are rewritten to the following equations (62) and (63), respectively.

$$I_{51} = I_0 - I_b + (i + i') \tag{62}$$

$$= I_0 - I_b + \left[ \frac{V_{IN} - (V_{BE21} - V_{BE22})}{R} + \frac{V_{BE23} - V_{BE24}}{R} \right]$$

$$= I_0 - I_b + \frac{V_{IN}}{R}$$

$$I_{52} = I_0 + I_b - (i + i') \tag{63}$$

$$= I_0 + I_b - \left[ \frac{V_{IN} - (V_{BE21} - V_{BE22})}{R} + \frac{V_{BE23} - V_{BE24}}{R} \right]$$

$$= I_0 + I_b - \frac{V_{IN}}{R}$$

As a result, a differential output current ΔI of this OTA, which is defined as ($I_{51}$–$I_{52}$), is expressed as $$\Delta I = I_{51} - I_{52} = \frac{2V_{IN}}{R} \tag{64}$$

It is seen from the equation (64) that the differential output current ΔI is proportional to the differential input voltage $V_{IN}$. This means that this circuit is capable of an OTA function.

As described above, the bipolar OTA according to the fifth embodiment has the same advantages or effects as those of the first embodiment.

Sixth Embodiment

Figure 9:
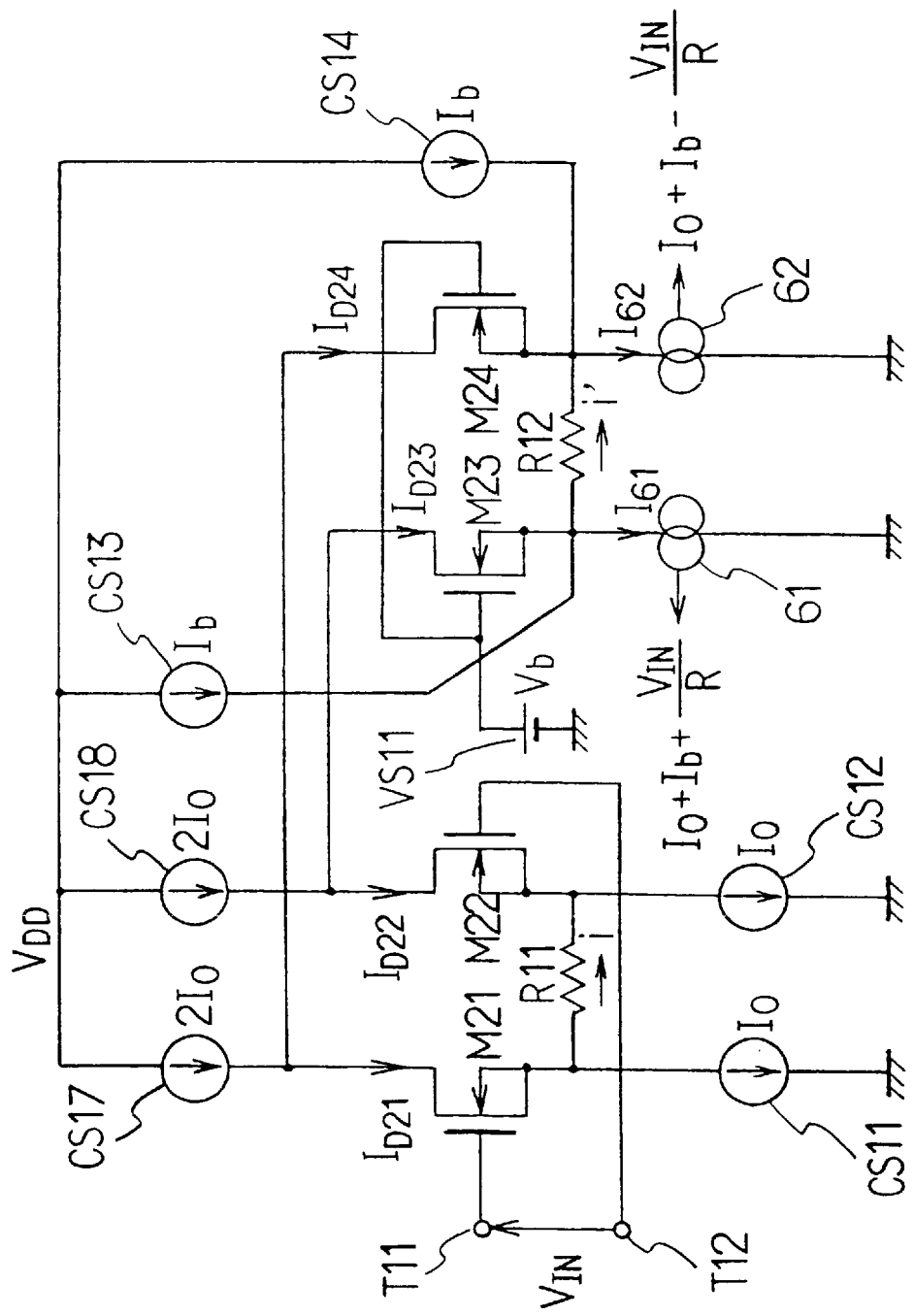
FIG. 9 is a circuit diagram of a MOS OTA according to a sixth embodiment of the invention, which is equivalent to one obtained by replacing the bipolar transistors with MOSFETs in the OTA of FIG. 8.

A MOS OTA according to a sixth embodiment of the present invention is shown in FIG. 9, which corresponds to one obtained by replacing the bipolar transistors in the fifth embodiment of FIG. 8 with MOSFETs.

As shown in FIG. 9, this OTA includes a first balanced differential pair of n-channel MOSFETs M21 and M22 whose the transconductance parameters β are equal to each other. Sources of the MOSFETs M21 and M22 are coupled together through a first resistor R1 having a resistance R.

The source of the MOSFET M21 is further connected to one end of a constant current sink CS11 sinking a constant current $I_0$. The other end of the current sink CS11 is grounded. The source of the MOSFET M22 is connected to one end of a constant current sink CS12 sinking the same constant current $I_0$ as that of the current sink CS11. The other end of the current sink CS12 is grounded. The MOSFETs M21 and M22 are driven by the corresponding current sinks CS11 and CS12, respectively.

A gate of the MOSFET M21 is connected to an input terminal T11 and a gate of the MOSFET M22 is connected to another input terminal T12. A differential input voltage $V_{IN}$ is applied across the pair of input terminals T11 and T12. A current i will flow through the resistor R1 according to the value of the differential input voltage $V_{IN}$.

This first differential pair is the same in configuration as that of the second embodiment of FIG. 5. However, the former is different from the latter in the collector connection of the MOSFETs M21 and M22.

Specifically, a drain of the MOSFET M21 is directly connected to one end of a constant current source CS17 supplying a constant current $2I_0$. The other end of the source CS17 is connected to a power supply terminal (not shown) to be applied with a power supply voltage $V_{DD}$. The drain of the MOSFET M22 is directly connected to an input end of a constant current source CS18 supplying the same constant current $2I_0$ as that of the current source CS17. The other end of the current source CS18 is connected to the power supply terminal to be applied with the power supply voltage $V_{DD}$.

This OTA further includes a second differential pair of n-channel MOSFETs M23 and M24, which are the same in polarity as the MOSFETs M21 and M22.

A drain of the MOSFET M23 is directly connected to the drain of the MOSFET M22. A drain of the MOSFET M24 is directly connected to a drain of the MOSFET M21.

Gates of the MOSFETs M23 and M24 are coupled together to be connected to a positive end of a constant voltage source VS11 supplying a constant bias voltage $V_b$. A negative end of the source VS11 is grounded. Thus, the constant bias voltage $V_b$ is applied to the coupled gates of the MOSFETs M23 and M24, respectively.

Sources of the MOSFETs M23 and M24 are coupled together through a second resistor R2 having the same resistance R as that of the first resistor R1.

The source of the MOSFET M23 is further connected to one end of a constant current source CS13 supplying a constant current $I_b$. The other end of the current source CS13 is connected to the power supply terminal to be applied with the supply voltage $V_{DD}$. The source of the MOSFET M24 is further connected to one end of a constant current source CS14 supplying the same constant current $I_b$ as that of the current source CS13. The other end of the current source CS14 is connected to the power supply terminal to be applied with the supply voltage $V_{DD}$.

The two current sources CS13 and CS14 serve to form a current path, thereby allowing a current i' to flow through the second resistor R12.

The source of the MOSFET M23 is connected to an input end of a current mirror subcircuit 61 serving as a load of the MOSFET M23. A ground end of the subcircuit 61 is grounded. The source of the MOSFET M24 is connected to an input end of a current mirror subcircuit 62 serving as a load of the MOSFET M24. A ground end of the subcircuit 62 is grounded.

An output current $I_{OUT1}$ is derived from an output end of the current mirror subcircuit 61. Another output current $I_{OUT2}$ is derived from an output end the current mirror subcircuit 62.

The first differential pair of the MOSFETs M21 and M22 and the first resistor R11 constitutes an input circuit or stage S1. The second differential pair of the MOSFETs M23 and M24, and the second resistor R12 constitutes a non-linearity compensation circuit or stage S2. The two current mirror circuits 61 and 62 constitute an output circuit or stage S3.

In the sixth embodiment, the transconductance parameters β of the first to fourth MOSFETs are equal to each other.

Next, the operation of the MOS OTA according to the sixth embodiment is explained below.

In this OTA, it is clear that the following equation (65), (66), (67) and (68) are established.

$$V_{IN} = V_{GS21} - V_{GS22} + Ri \tag{65}$$

$$i = \frac{V_{IN} - (V_{GS21} - V_{GS22})}{R} \tag{66}$$

$$I_{D21} = I_o + i \tag{67}$$

$$I_{D22} = I_o - i \tag{68}$$

where $V_{GS21}$ and $V_{GS22}$ are the gate-to-source voltages of the MOSFETs M21 and M22, and $I_{D21}$ and $I_{D22}$ are drain currents thereof, respectively.

Further, the second differential pair is composed of the n-channel MOSFETs M23 and M24 which are the same in polarity as that of the first differential pair. The constant current sources CS17 and CS18 each supplying the constant currents of $2I_0$ are provided for the MOSFETs M23 and M24, respectively, which is in the same way as that in the conventional OTA of FIG. 2.

Therefore, the drain currents $I_{D23}$ and $I_{D24}$ are expressed as $$I_{D23} = 2I_0 - I_{D22} = I_0 - i \quad (69)$$

$$I_{D24} = 2I_0 - I_{D21} = I_0 + i \quad (70)$$

Currents flowing at the input ends of the current mirror subcircuits 61 and 62 are defined as $I_{61}$ and $I_{62}$, $I_{61}$ and $I_{62}$ are expressed as the follows.

$$I_{61} = I_b - i' + I_{D23} = I_b - i' + I_0 - i \quad (71)$$

$$I_{62} = I_b + i' + I_{D24} = I_b + i' + I_0 + i \quad (72)$$

On the other hand, the current i' flowing through the second emitter resistor R2 is expressed as $$i' = \frac{V_{GS23} - V_{GS24}}{R} \quad (73)$$

Substituting the equations (66) and (73) into the equations (71) and (72), the currents $I_{61}$ and $I_{62}$ are rewritten to the following equations (74) and (75), respectively.

$$\begin{aligned} I_{61} &= I_0 - I_b + (i + i') \\ &= I_0 - I_b + \left[ \frac{V_{IN} - (V_{GS21} - V_{GS22})}{R} + \frac{V_{GS23} - V_{GS24}}{R} \right] \\ &= I_0 - I_b + \frac{V_{IN}}{R} \end{aligned} \quad (74)$$

$$\begin{aligned} I_{62} &= I_0 + I_b - (i + i') \\ &= I_0 + I_b - \left[ \frac{V_{IN} - (V_{GS21} - V_{GS22})}{R} + \frac{V_{GS23} - V_{GS24}}{R} \right] \\ &= I_0 + I_b - \frac{V_{IN}}{R} \end{aligned} \quad (75)$$

As a result, a differential output current $\Delta I$ of this OTA, which is defined as $(I_{61} - I_{62})$, is expressed as $$\Delta I = I_{61} - I_{62} = \frac{2V_{IN}}{R} \quad (76)$$

It is seen from the equation (76) that the differential output current $\Delta I$ is proportional to the differential input voltage $V_{IN}$. This means that this circuit is capable of an OTA function.

As described above, the MOS OTA according to the sixth embodiment has the same advantages or effects as those of the first embodiment.

Seventh Embodiment

Figure 10:
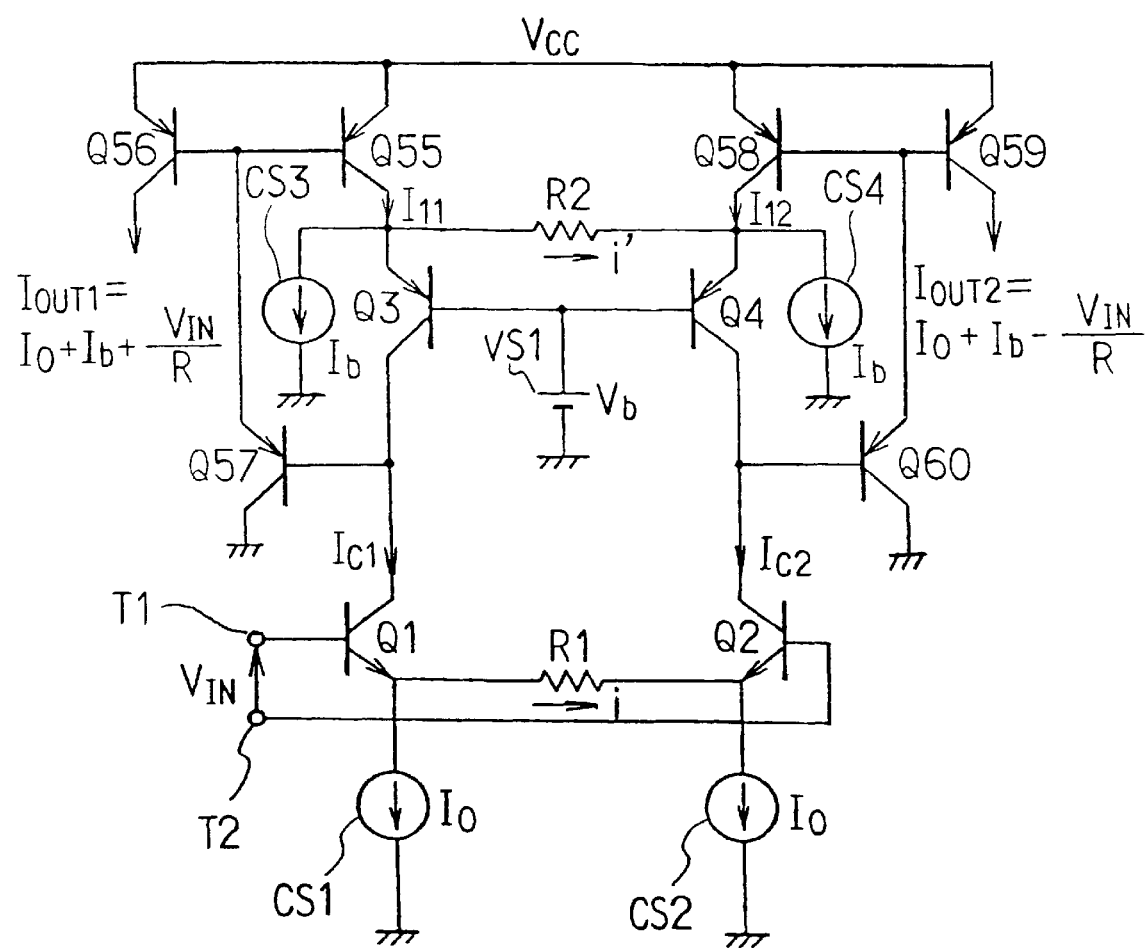
FIG. 10 is a circuit diagram of a bipolar OTA according to a seventh embodiment of the invention, which corresponds to the combination of the bipolar OTA according to the first embodiment and an output circuit.

A bipolar OTA according to a seventh embodiment of the present invention is shown in FIG. 10, which corresponds to the combination of the bipolar OTA according to the first embodiment of FIG. 4 and an output circuit thereof.

Therefore, the description about the same configuration is omitted here by adding the same reference characters as those in the first embodiment to the corresponding elements for the sake of simplification.

The current mirror subcircuit 11 includes pnp bipolar transistors Q55, Q56 and Q57. Bases of the transistors Q55 and Q56 are coupled together. Emitters of the transistors Q55 and Q56 are connected to the power supply terminal to be applied with the supply voltage $V_{CC}$. A collector of the transistor Q55 is connected to the emitter of the transistor Q3.

An emitter of an npn bipolar transistor Q57 is connected to the coupled bases of the transistors Q55 and Q56. A base of the transistor Q57 is connected to the collector of the transistor Q3. A collector of the transistor Q57 is grounded.

A mirror current of the output current $I_{11}$ is derived from the collector of the transistor Q56.

Similarly, the current mirror subcircuit 12 includes pnp bipolar transistors Q58, Q59 and Q60. Bases of the transistors Q58 and Q59 are coupled together. Emitters of the transistors Q58 and Q59 are connected to the power supply terminal to be applied with the supply voltage $V_{CC}$. A collector of the transistor Q58 is connected to the emitter of the transistor Q4.

An emitter of an npn bipolar transistor Q60 is connected to the coupled bases of the transistors Q58 and Q59. A base of the transistor Q60 is connected to the collector of the transistor Q4. A collector of the transistor Q60 is grounded.

A mirror current of the output current $I_{12}$ is derived from the collector of the transistor Q59.

The two bipolar transistors Q5 and Q6 in the first embodiment are canceled, because the combination of the transistors Q55, Q56 and Q57 and the combination of the transistors Q58, Q59 and Q60 serving as the respective current mirror circuits 11 and 12 have the same functions as those of the transistors Q5 and Q6.

Eighth Embodiment

Figure 11:
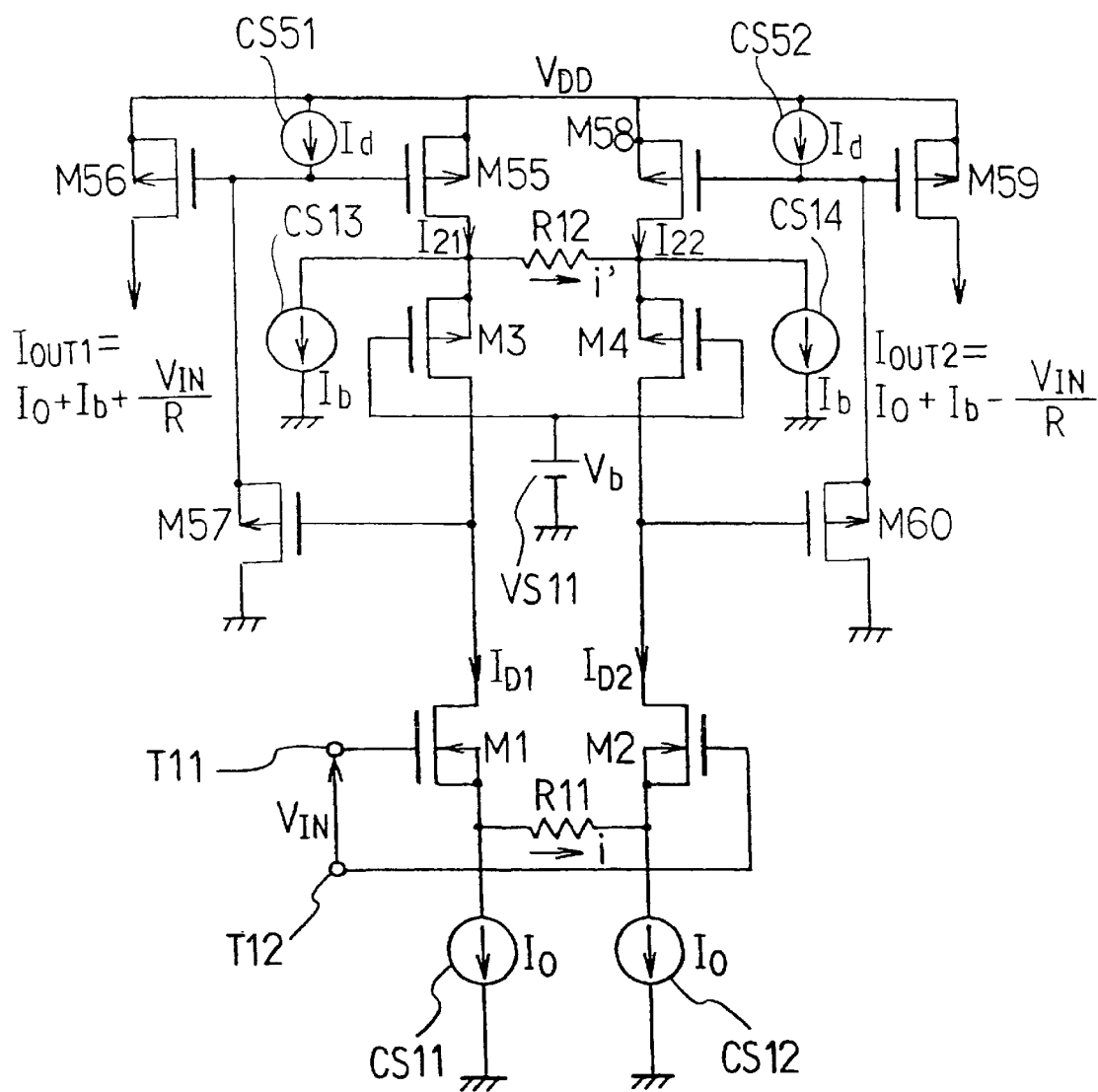
FIG. 11 is a circuit diagram of a MOS OTA according to an eighth embodiment of the invention, which corresponds to the combination of the MOS OTA according to the second embodiment and an output circuit.

A MOS OTA according to an eighth embodiment of the present invention is shown in FIG. 11, which corresponds to the combination of the MOS OTA according to the second embodiment of FIG. 5 and an output circuit thereof.

Therefore, the description about the same configuration is omitted here by adding the same reference characters as those in the second embodiment to the corresponding elements for the sake of simplification.

The current mirror subcircuit 21 includes p-channel MOSFETs M55, M56 and M57. Gates of the MOSFETs M55 and M56 are coupled together. Gates of the MOSFETs M55 and M56 are connected to the power supply terminal to be applied with the supply voltage $V_{DD}$. A drain of the MOSFET M55 is connected to the source of the MOSFET M3.

A source of the p-channel MOSFET M57 is connected to the coupled gates of the MOSFETs M55 and M56. A gate of the MOSFET M57 is connected to the drain of the MOSFET M3. A drain of the MOSFET M57 is grounded.

A mirror current of the output current $I_{21}$ is derived from the drain of the MOSFET M56.

Similarly, the current mirror subcircuit 22 includes p-channel MOSFETs M58, M59 and M60. Gates of the MOSFETs M58 and M59 are coupled together. Sources of the MOSFET M58 and M59 are connected to the power supply terminal to be applied with the supply voltage $V_{DD}$. A drain of the MOSFET M58 is connected to the source of the MOSFET M4.

A source of a p-channel MOSFET M60 is connected to the coupled gates of the MOSFETs M58 and M59. A gate of the MOSFET M60 is connected to the drain of the MOSFET M4. A drain of the MOSFET M60 is grounded.

A mirror current of the output current $I_{22}$ is derived from the drain of the MOSFET M59.

The two MOSFETs M5 and M6 and the two constant current sinks CS15 and CS16 in the second embodiment are canceled, because the combination of the MOSFETs M55, M56 and M57 and the combination of the MOSFET M58, M59 and M60 serving as the respective current mirror circuits 21 and 22 have the same functions as those of the MOSFETs M5 and M6 and the current sinks CS15 and CS16.

Ninth Embodiment

Figure 12:
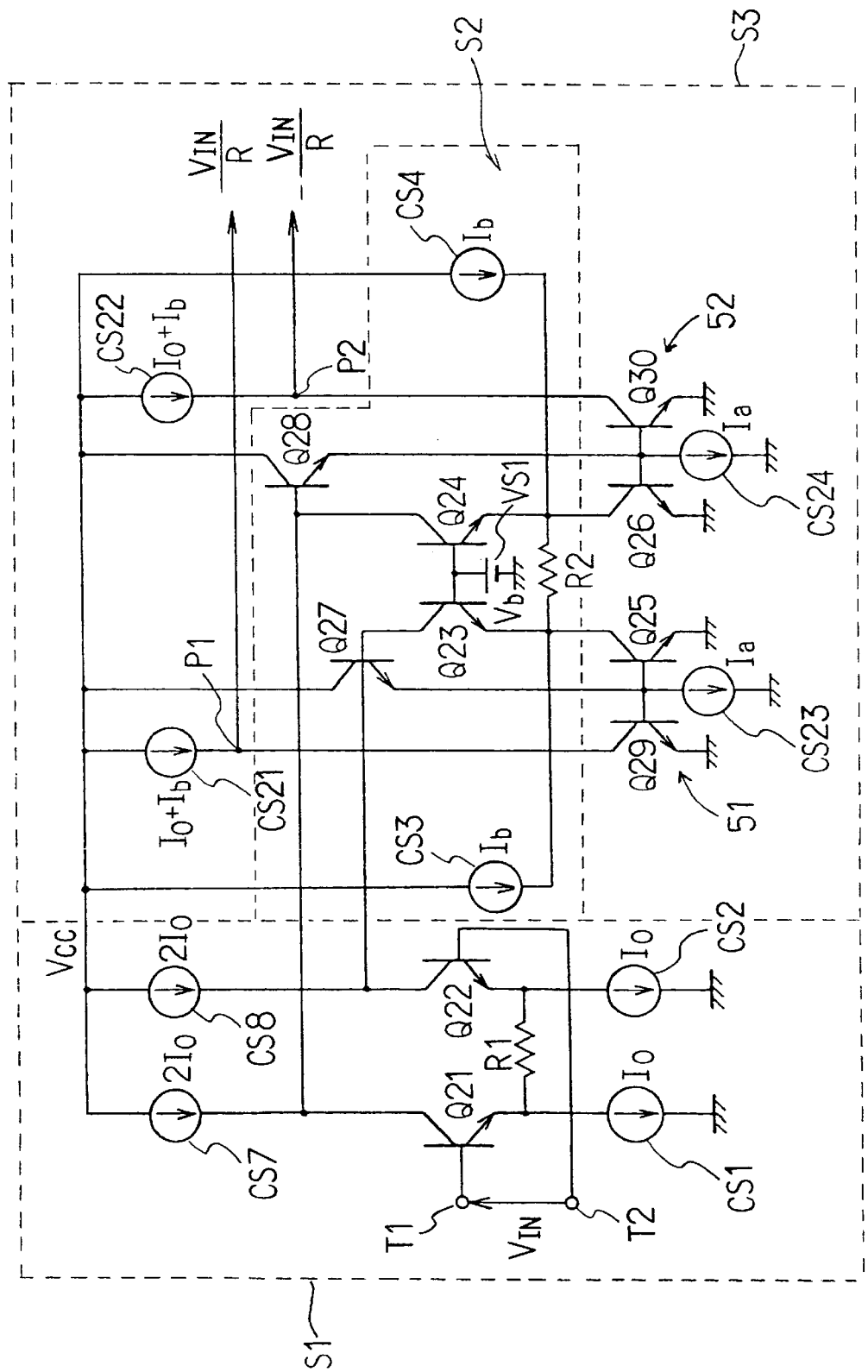
FIG. 12 is a circuit diagram of a bipolar OTA according to a ninth embodiment of the invention, which corresponds to the combination of the bipolar OTA according to the fifth embodiment and an output circuit.

A bipolar OTA according to a ninth embodiment of the present invention is shown in FIG. 12, which corresponds to the combination of the bipolar OTA according to the fifth embodiment of FIG. 8 and an output circuit thereof.

Therefore, the description about the same configuration is omitted here by adding the same reference characters as those in the fifth embodiment to the corresponding elements for the sake of simplification.

The current mirror subcircuit 51 includes a npn bipolar transistors Q25 and Q29. Bases of the transistors Q25 and Q29 are coupled together. Emitters of the transistors Q25 and Q29 are grounded. A collector of the transistor Q25 is connected to the emitter of the transistor Q23. A collector of the transistor Q29 is connected to the power supply terminal through a constant current source CS21 supplying a constant current $(I_0+I_b)$.

An emitter of an npn bipolar transistor Q27 is connected to the coupled bases of the transistors Q25 and Q29. A base of the transistor Q27 is connected to the collector of the transistor Q23. A collector of the transistor Q27 is connected to the power supply terminal to be applied with the supply voltage $V_{CC}$.

A constant current source CS23 supplying a constant current $I_a$ is connected to the coupled bases of the transistors Q25 and Q29 and the ground.

A mirror current of the output current $I_{51}$ is derived from the connection point P1 of the collector of the transistor Q29 with the constant current source CS21.

The combination of the transistor Q27 and the constant current sources CS21 and CS23 has two functions of biasing the current mirror subcircuit 51 and level-shifting the output current $I_{61}$. Therefore, the output current $I_{51}$ itself is proportional to the differential input voltage $V_{IN}$; i.e., $I_{51}=(V_{IN}/R)$.

Similarly, the current mirror subcircuit 52 includes npn bipolar transistors Q26 and Q30. Base of the transistors Q26 and Q30 are coupled together. Emitters of the transistors Q26 and Q30 are grounded. A collector of the transistor Q26 is connected to the emitter of the transistor Q24. A collector of the transistor Q30 is connected to the power supply terminal through a constant current source CS22 supplying a constant current $(I_0+I_b)$.

An emitter of an npn bipolar transistor Q28 is connected to the coupled bases of the transistors Q26 and Q30. A base of the transistor Q28 is connected to the collector of the transistor Q24. A collector of the transistor Q28 is connected to the power supply terminal to be applied with the supply voltage $V_{CC}$.

A constant current source CS24 supplying a constant current $I_a$ is connected to the coupled bases of the transistors Q26 and Q30 and the ground.

A mirror current of the output current $I_{52}$ is derived from the connection point P2 of the collector of the transistor Q30 with the constant current source CS22.

The combination of the transistor Q28 and the constant current sources CS22 and CS24 has two functions of biasing the current mirror subcircuit 52 and level-shifting the output current $I_{52}$. Therefore, the output current $I_{52}$ itself is proportional to the differential input voltage $V_{IN}$; i.e., $I_{51}=-(V_{IN}/R)$.

Tenth Embodiment

Figure 13:
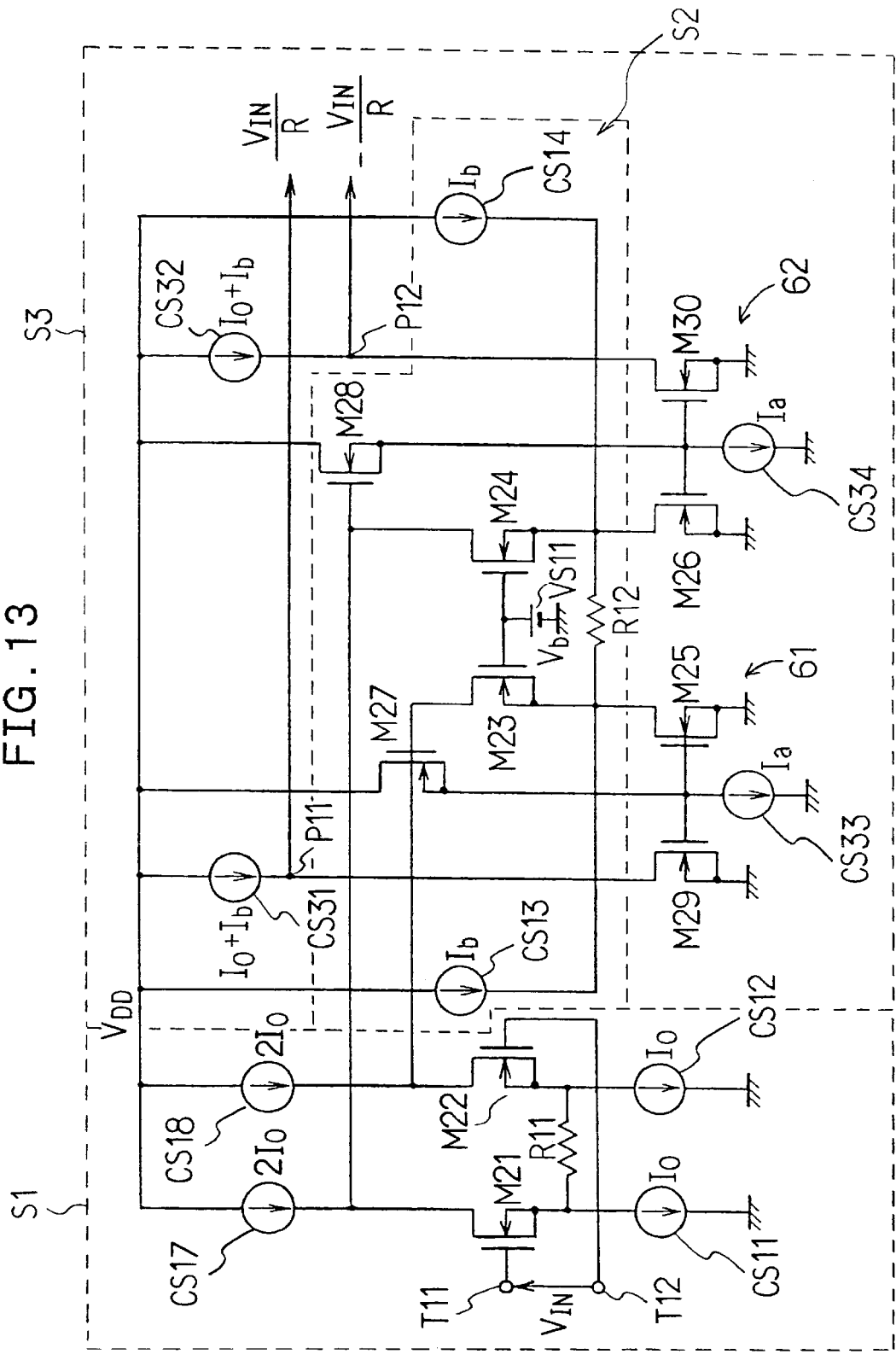
FIG. 13 is a circuit diagram of a MOS OTA according to a tenth embodiment of the invention, which corresponds to the combination of the MOS OTA according to the sixth embodiment and an output circuit.

A MOS OTA according to a tenth embodiment of the present invention is shown in FIG. 13, which corresponds to the combination of the MOS OTA according to the sixth embodiment of FIG. 9 and an output circuit thereof.

Therefore, the description about the same configuration is omitted here by adding the same reference characters as those in the sixth embodiment to the corresponding elements for the sake of simplification.

The current mirror subcircuit 61 includes n-channel MOSFETs M25 and M29. Gates of the MOSFETs M25 and M29 are coupled together. Sources of the MOSFETs M25 and M29 are grounded. A drain of the MOSFET M25 is connected to the source of the MOSFET M23. A drain of the MOSFET M29 is connected to the power supply terminal through a constant current source CS31 supplying a constant current $(I_0+I_b)$.

A source of an channel MOSFET M27 is connected to the coupled gates of the MOSFETs M25 and M29. A gate of the MOSFET M27 is connected to the drain of the MOSFET M23. A drain of the MOSFET M27 is connected to the power supply terminal to be applied with the supply voltage $V_{DD}$.

A constant current source CS33 supplying a constant current $I_a$ is connected to the coupled gates of the MOSFETs M25 and M29 and the ground.

A mirror current of the output current $I_{61}$ is derived from the connection point P11 of the drain of the MOSFET M29 with the constant current source CS31.

The combination of the MOSFET M27 and the constant current sources CS31 and CS33 has two functions of biasing the current mirror subcircuit 61 and level-shifting the output current $I_{61}$. Therefore, the output current $I_{61}$ itself is proportional to the differential input voltage $V_{IN}$; i.e., $I_{61}=(V_{IN}/R)$.

Similarly, the current mirror subcircuit 62 includes n-channel MOSFETs M26 and M30. Gates of the MOSFETs M26 and M30 are coupled together. Sources of the MOSFETs M26 and M30 are grounded. A drain of the MOSFET M26 is connected to the source of the MOSFET M24. A drain of the MOSFET M30 is connected to the power supply terminal through a constant current source CS32 supplying a constant current $(I_0+I_b)$.

A source of an n-channel MOSFET M28 is connected to the coupled gates of the MOSFETs M26 and M30. A gate of the MOSFET M28 is connected to the drain of the MOSFET M24. A drain of the MOSFET M28 is connected to the power supply terminal to be applied with the supply voltage $V_{DD}$.

A constant current source CS34 supplying a constant current $I_a$ is connected to the coupled gates of the MOSFETs M26 and M30 and the ground.

A mirror current of the output current $I_{62}$ is derived from the connection point P12 of the drain of the MOSFET M30 with the constant current source CS32.

The combination of the MOSFET M28 and the constant current sources CS32 and CS34 has two functions of biasing the current mirror subcircuit 62 and level-shifting the output current $I_{62}$. Therefore, the output current $I_{62}$ itself is proportional to the differential input voltage $V_{IN}$; i.e., $I_{62}=-(V_{IN}/R)$.

Eleventh Embodiment

Figure 14:
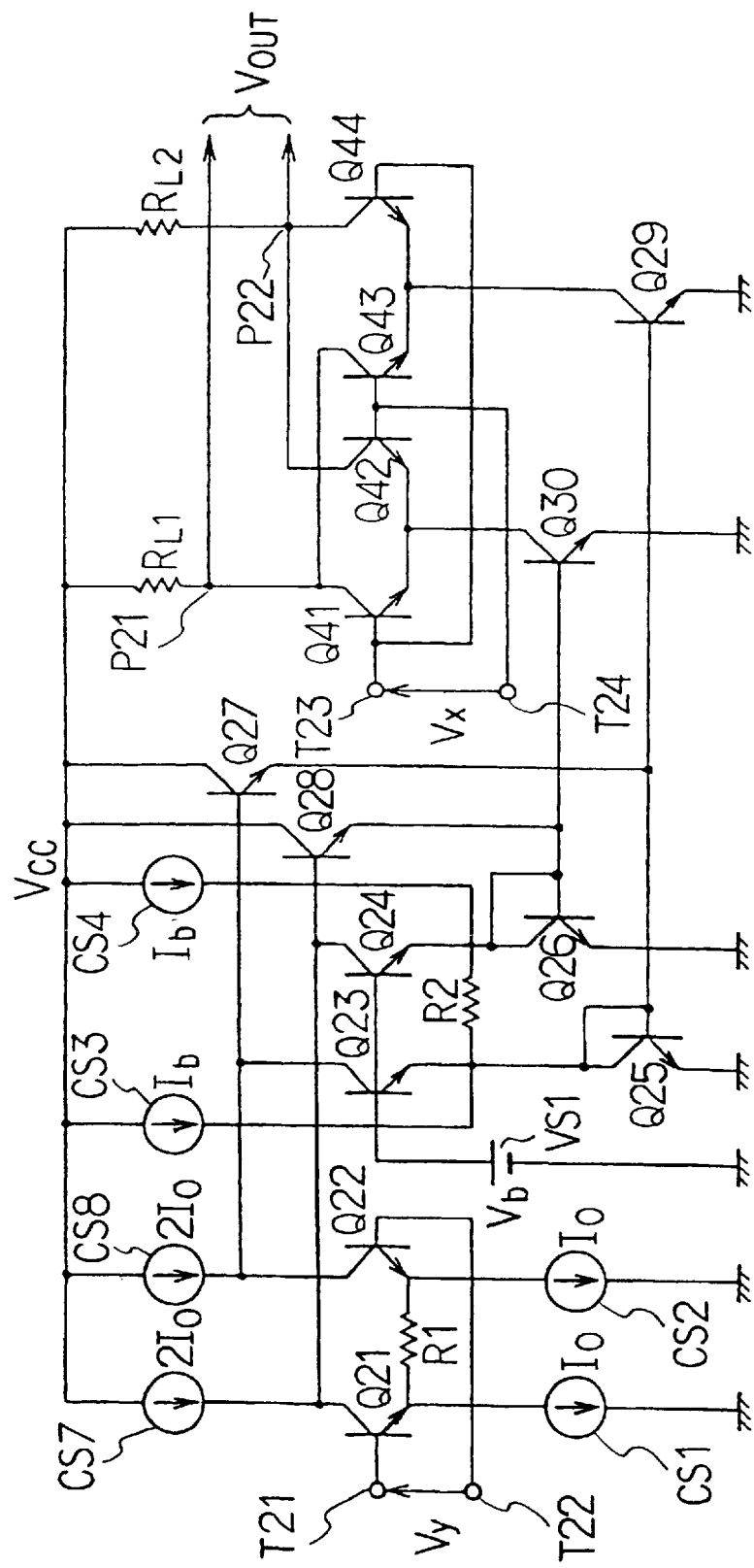
FIG. 14 is a circuit diagram of a bipolar multiplier according to an eleventh embodiment of the invention, which uses the bipolar OTA according to the ninth embodiment of FIG. 12.

A bipolar multiplier according to an eleventh embodiment of the present invention is shown in FIG. 14, which corresponds to the combination of the bipolar OTA according to the ninth embodiment of FIG. 12 including the output circuit and two differential pairs of npn bipolar transistors Q41 and Q42, and Q43 and Q44.

Therefore, the description about the same configuration is omitted here by adding the same reference characters as those in the ninth embodiment to the corresponding elements for the sake of simplification.

Figure 3:
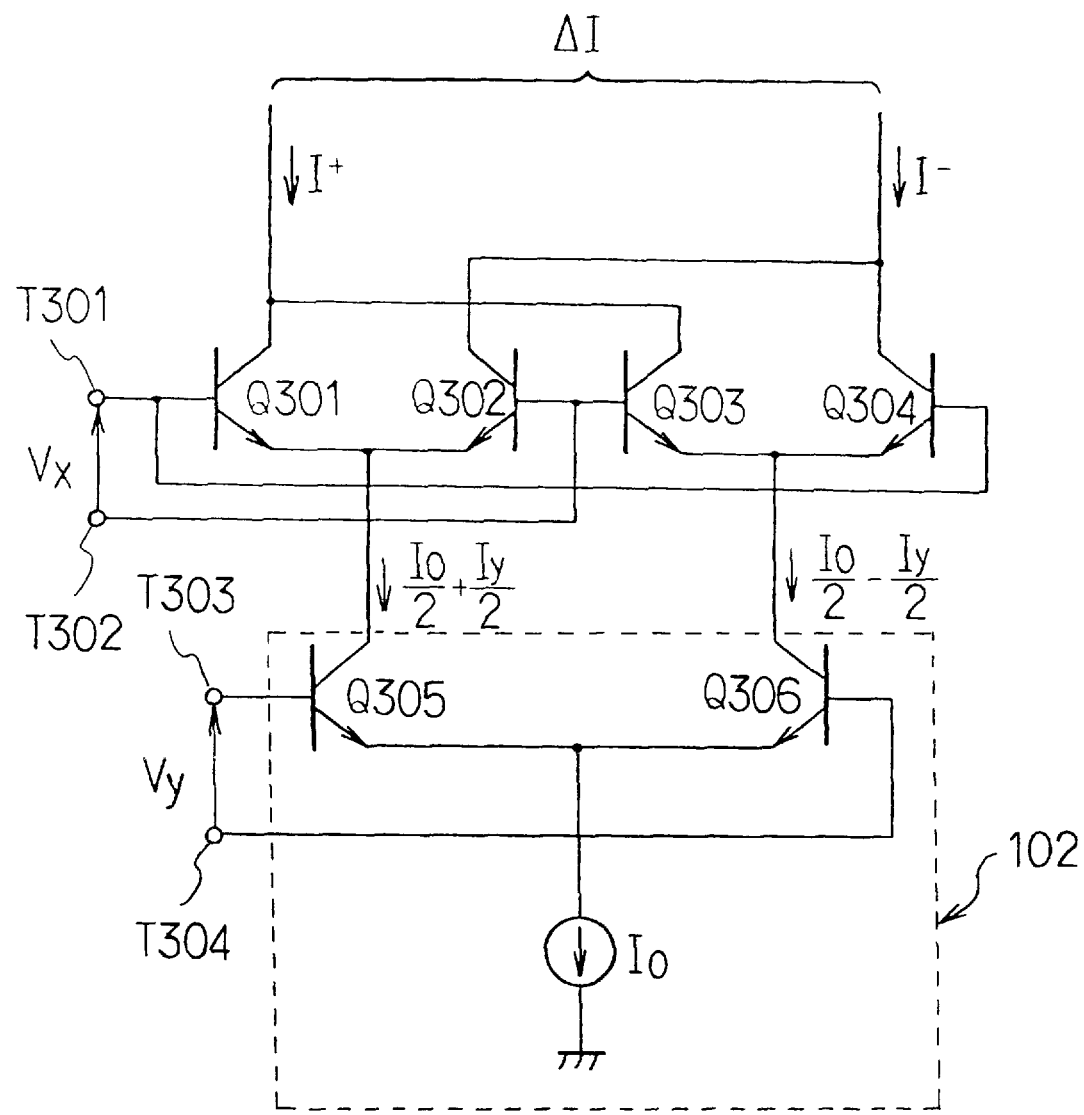
FIG. 3 is a circuit diagram of a well-known Gilbert multiplier cell.

In FIG. 14, the bipolar OTA according to the ninth embodiment of FIG. 12 is used to drive the differential pair of the bipolar transistors Q41 and Q42 and the differential pair of the transistors Q43 and Q44 by the output currents $I_{61}$ and $I_{51}$, respectively. In other words, this OTA serves as the differential voltage-current converter 102 of the Gilbert multiplier cell shown in FIG. 3.

A second input voltage $V_y$, which correspond to the differential input voltage $V_{IN}$, is applied across the bases of the transistors Q21 and Q22 through the pair of the input terminals T21 and T22.

Emitters of the npn bipolar transistors Q41 and Q42 are coupled together to be connected to the collector of the transistor Q30. Thus, the differential pair of the transistors Q41 and Q42 is driven by the output current $I_{61}$.

Similarly, emitters of the npn bipolar transistors Q43 and Q44 are coupled together to be connected to the collector of the transistor Q29. Thus, the differential pair of the transistors Q43 and Q44 is driven by the output current $I_{51}$.

Bases of the transistors Q41 and Q44 are coupled together to be connected to an input terminal T23. Bases of the transistors Q42 and Q43 are coupled together to be connected to another input terminal T24. A first input voltage $V_x$ is applied across the coupled bases of the transistors Q41 and Q44 and those of the transistors Q42 and Q43.

Collectors of the transistors Q41 and Q43 are coupled together to be connected to the power supply terminal (not shown) to be applied with the supply voltage $V_{CC}$ through a load resistor $R_{L1}$. Collectors of the transistors Q42 and Q44 are coupled together to be connected to the power supply terminal to be applied with the supply voltage $V_{CC}$ through another load resistor $R_{L2}$ having the same resistance as that of the resistor $R_{L1}$.

An output voltage is derived from the connection point P21 of the load resistor $R_{L1}$ and the coupled collectors of the transistor Q41 and Q43. Another output voltage is derived from the connection point P22 of the load resistor $R_{L2}$ and the coupled collectors of the transistor Q42 and Q44. A differential output voltage $V_{OUT}$, which is defined as the difference between the two output voltages, contains the multiplication result of the first and second input voltages $V_x$ and $V_y$.

With the bipolar multiplier according to the eleventh embodiment, the bipolar OTA serving as the differential voltage-current converter 102 has an improved linearity with respect to the second input voltage $V_y$. This means that this multiplier is capable of an ideal, linear operation with respect to the second input voltage $V_y$.

In this multiplier according to the eleventh embodiment, the MOS OTA according to the tenth embodiment of FIG. 13 may be used instead of the bipolar OTA according to the ninth embodiment of FIG. 12.

Figure 15:
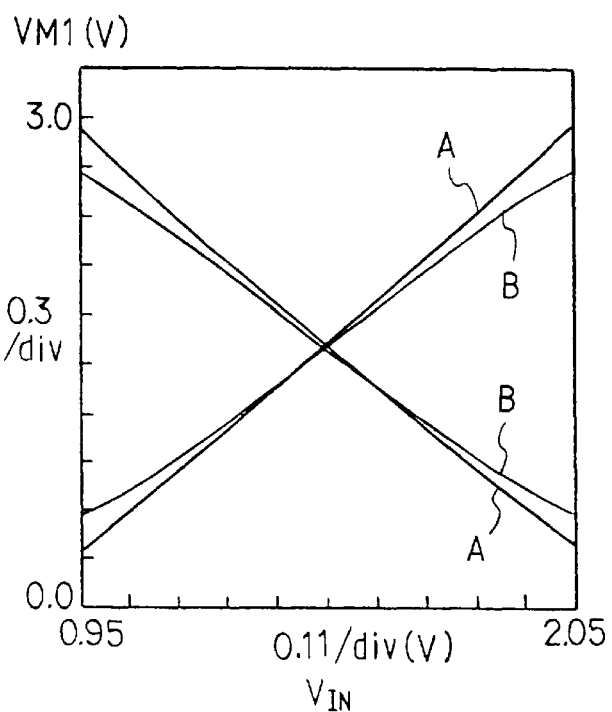
FIG. 15 is a graph showing the measured transfer characteristics of the bipolar OTA according to the seventh embodiment of FIG. 10.

FIG. 15 shows the measured transfer characteristics of the bipolar OTA according to the seventh embodiment of FIG. 10, which was obtained under the condition that $V_{CC}$=3.0 V, R=10 kΩ, $I_0$=50 µA, $I_b$=10 µA, and $V_b$=1.4 V.

In FIG. 15, the curve A shows the characteristic of the seventh embodiment, and the curve B shows a non-compensated OTA where the second resistor is canceled in the seventh embodiment. The curve A indicates that the bipolar OTA according to the seventh embodiment has a linear transfer characteristic within the entire possible input voltage range, which is over 1 V.

Figure 16:
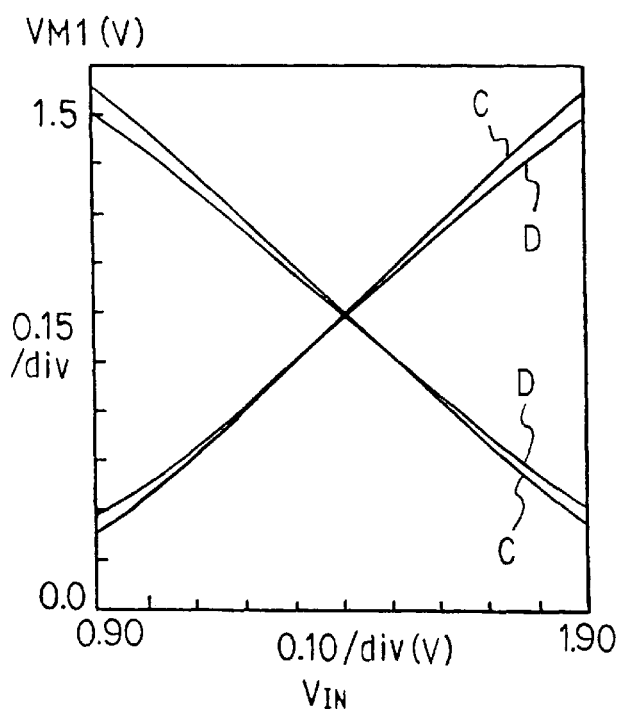
FIG. 16 is a graph showing the measured transfer characteristics of the bipolar OTA according to the ninth embodiment of FIG. 12.

FIG. 16 shows the measured transfer characteristics of the bipolar OTA according to the ninth embodiment of FIG. 12, which was obtained under the condition that $V_{CC}$=1.9 V, R=10 kΩ, $I_0$=50 µA, $I_b$=10 µA, and $V_b$=1.4 V.

In FIG. 16, the curve C shows the characteristic of the ninth embodiment, and the curve D shows a non-compensated OTA where the second resistor is canceled in the ninth embodiment. The curve C indicates that the bipolar OTA according to the ninth embodiment has a linear transfer characteristic within the entire possible input voltage range, which is over 1 V.

Figure 17:
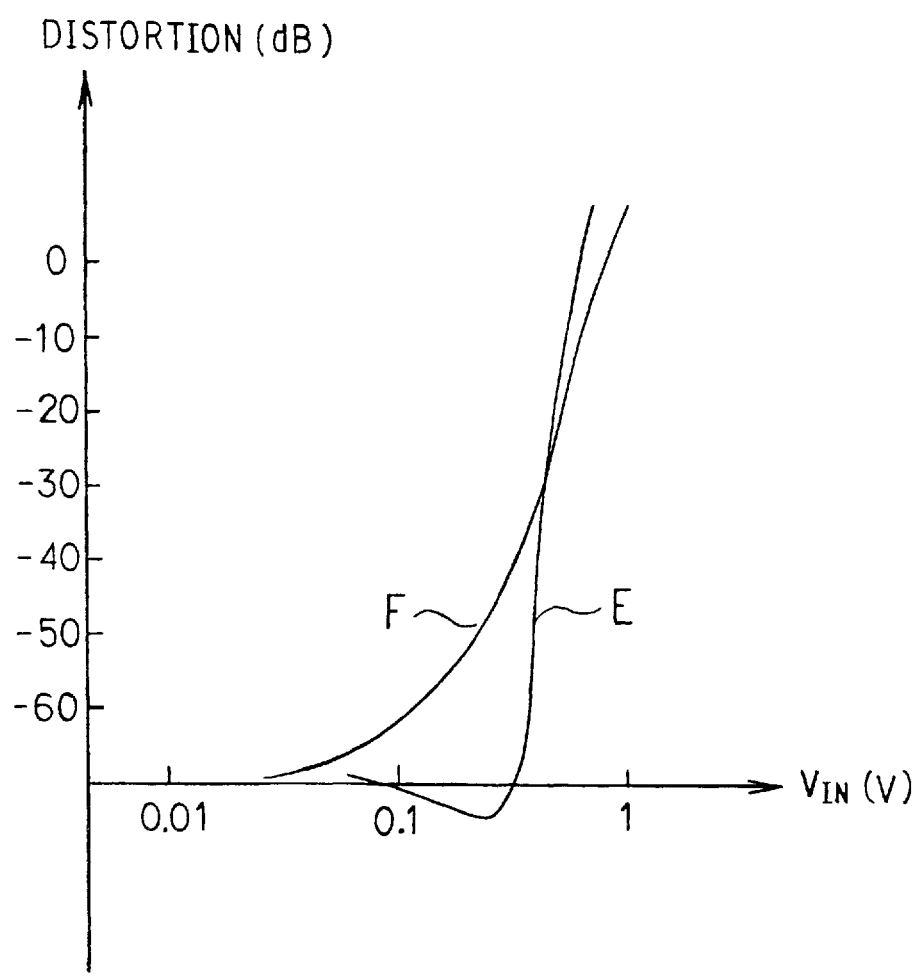
FIG. 17 is a graph showing the measured total harmonic distortion characteristics of the bipolar OTAs according to the seventh and ninth embodiments of FIGS. 10 and 12.

FIG. 17 shows the measured total harmonic distortion characteristics of the bipolar OTAs according to the seventh and ninth embodiments of FIGS. 4 and 12. The curve E shows the characteristic of the seventh embodiment, and the curves F shows the characteristic of the ninth embodiment.

In the bipolar OTA according to the seventh embodiment, when a sine wave of 1 kHz is inputted into this OTA, the value of the total harmonic distortion is 1% (−40 dB) at $V_{IN}$=270 mV$_{rms}$ (=764 mV$_{p-p}$), and it is 0.1% (−60 dB) at $V_{IN}$=265 mV$_{rms}$ (=750 mV$_{p-p}$).

In the bipolar OTA according to the ninth embodiment, when a sine wave of 1 kHz is inputted into this OTA, the value of the total harmonic distortion is 1% (−40 dB) at $V_{IN}$=320 mV$_{rms}$ (=905 mV$_{p-p}$), and it is 0.1% (−60 dB) at $V_{IN}$=145 mV$_{rms}$ (=396 mV$_{p-p}$).

It is seen from the curves E and F in FIG. 17 that the non-linear compensation is more effective in the seventh embodiment than that of the ninth embodiment.

In the invention, it is not necessary that the first and second resistors have the same resistance value. They may have different resistance values. By changing the resistance value of the second resistor, the non-linearity compensation function can be adjusted as necessary.

For example, when the first resistance has a value of 10 kΩ, and the second resistor has a value of 2.2 kΩ in the ninth embodiment, the value of the total harmonic distortion is 0.1% (−60 dB) at $V_{IN}$=280 mV$_{rms}$ (=792 mV$_{p-p}$). This value of $V_{IN}$ is near the value ($V_{IN}$=265 mV$_{rms}$=750 mV$_{p-p}$) of the eighth embodiment.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An operational transconductance amplifier comprising:
   a first differential pair of first and second transistors respectively driven by first and second current sources or sinks, said first differential pair constituting an input transistor pair:
   a first resistor connected to a first signal terminal of said first transistor and a first signal terminal of said second transistor;
   a differential input signal being applied across a control terminal of said first transistor and a control terminal of said second transistor;

a first current flowing through said first transistor and a second current flowing through said second transistor;

a second differential pair of third and fourth transistors, said second differential pair constituting an output transistor pair;

a second resistor connected to a first signal terminal of said third transistor and a first signal terminal of said fourth transistor;

a third current flowing through said third transistor and a fourth current flowing through said fourth transistor;

said third current having a first relationship with said first current to contain a component proportional to said input signal, and said fourth current having a second relationship with said second current to contain a component proportional to said input signal;

a fifth current flowing through said first resistor in response to said applied differential input signal; and a current path connected to said first signal terminals of said third and fourth transistors, thereby allowing a sixth current to flow through said second resistor;

a bias voltage being applied to a control terminal of said third transistor and a control terminal of said fourth transistor; and an output signal being derived from said first signal terminal of said third transistor and said first signal terminal of said fourth transistor.

2. An operational transconductance amplifier as claimed in claim 1, wherein a second signal terminal of said first transistor is directly connected to a second signal terminal of said third transistor, and a second signal terminal of said second transistor is directly connected to a second signal terminal of said fourth transistor.

3. An operational transconductance amplifier as claimed in claim 1, wherein said third current is supplied by a constant current source and said fourth current is supplied by another constant current source.

4. An operational transconductance amplifier as claimed in claim 1, further comprising two additional constant current sources or sinks;

wherein a second signal terminal of said first transistor is directly connected to a second signal terminal of said third transistor, and a second signal terminal of said second transistor is directly connected to a second signal terminal of said fourth transistor;

and wherein said first and third currents are supplied by one of said additional current sources and said second and fourth currents are supplied by the other of said additional current sources.

5. An operational transconductance amplifier as claimed in claim 1, further comprising an output circuit having a level-shifting transistor;

wherein said level-shifting transistor has a function of shifting the dc level of said output current, so that said output current is proportional to said input voltage.

6. An operational transconductance amplifier as claimed in claim 1, wherein said first and second transistors are opposite in polarity to said third and fourth transistors.

7. An operational transconductance amplifier as claimed in claim 1, wherein said first and second transistors are the same in polarity to said third and fourth transistors.

8. An operational transconductance amplifier comprising:

a first differential pair of first and second bipolar transistors respectively driven by first and second current sources or sinks, said first differential pair constituting an input transistor pair;

a first resistor connected to an emitter of said first transistor and an emitter of said second transistor;

a differential input signal being applied across a base of said first transistor and a base of said second transistor;

a first current flowing through said first transistor and a second current flowing through said second transistor;

a second differential pair of third and fourth bipolar transistors, said second differential pair constituting an output transistor pair;

a second resistor connected to an emitter of said third transistor and an emitter of said fourth transistor;

a third current flowing through said third transistor and a fourth current flowing through said fourth transistor;

said third current having a first relationship with said first current to contain a component proportional to said input signal, and said fourth current having a second relationship with said second current to contain a component proportional to said input signal;

a fifth current flowing through said first resistor in response to said applied differential input signal; and a current path connected to said emitters of said third and fourth transistors, thereby allowing a sixth current to flow through said second resistor;

a bias voltage being applied to a base of said third transistor and a base of said fourth transistor; and an output signal being derived from one of said emitter of said third transistor and said emitter of said fourth transistor.

9. An operational transconductance amplifier as claimed in claim 8, wherein a collector of said first transistor is directly connected to a collector of said third transistor, and a collector of said second transistor is directly connected to a collector of said fourth transistor.

10. An operational transconductance amplifier as claimed in claim 8, wherein said third current is supplied by a constant current source and said fourth current is supplied by another constant current source.

11. An operational transconductance amplifier as claimed in claim 8, further comprising two additional constant current sources or sinks;

wherein a collector of said first transistor is directly connected to a collector of said third transistor, and a collector of said second transistor is directly connected to a collector of said fourth transistor;

and wherein said first and third currents are supplied by one of said additional current sources and said second and fourth currents are supplied by the other of said additional current sources.

12. An operational transconductance amplifier as claimed in claim 8, further comprising an output circuit having a level-shifting transistor;

wherein said level-shifting transistor has a function of shifting the dc level of said output current, so that said output current is proportional to said input voltage.

13. An operational transconductance amplifier comprising:

a first differential pair of first and second MOSFETs respectively driven by first and second current sources or sinks, said first differential pair constituting an input transistor pair;

a first resistor connected to a source of said first MOSFET and a source of said second MOSFET;

a differential input signal being applied across a gate of said first MOSFET and a gate of said second MOSFET;

a first current flowing through said first MOSFET and a second current flowing through said second MOSFET;

a second differential pair of third and fourth MOSFETs, said second differential pair constituting an output transistor pair;

a second resistor connected to a source of said third MOSFET and a source of said fourth MOSFET;

a third current flowing through said third MOSFET and a fourth current flowing through said fourth MOSFET;

said third current having a first relationship with said first current to contain a component proportional to said input signal, and said fourth current having a second relationship with said second current to contain a component proportional to said input signal;

a fifth current flowing through said first resistor in response to said applied differential input signal; and a current path connected to said sources of said third and fourth transistors, thereby allowing a sixth current to flow through said second resistor;

a bias voltage being applied to a gate of said third MOSFET and a gate of said fourth MOSFET; and an output signal being derived from one of said source of said third MOSFET and said source of said fourth MOSFET.

14. An operational transconductance amplifier as claimed in claim 13, wherein a drain of said first MOSFET is directly connected to a drain of said third MOSFET, and a drain of said second MOSFET is directly connected to a drain of said fourth MOSFET.

15. An operational transconductance amplifier as claimed in claim 13, wherein said third current is supplied by a constant current source and said fourth current is supplied by another constant current source.

16. An operational transconductance amplifier as claimed in claim 13, further comprising two additional constant current sources or sinks;

wherein a drain of said first MOSFET is directly connected to a drain of said third MOSFET, and a drain of said second MOSFET is directly connected to a drain of said fourth MOSFET;

and wherein said first and third currents are supplied by one of said additional current sources and said second and fourth currents are supplied by the other of said additional current sources.

17. An operational transconductance amplifier as claimed in claim 13, further comprising an output circuit having a level-shifting transistor;

wherein said level-shifting transistor has a function of shifting the dc level of said output current, so that said output current is proportional to said input voltage.

18. A multiplier comprising:

(a) a differential voltage-current converter;

said converter including:

a first differential pair of first and second transistors respectively driven by first and second current sources or sinks, said first differential pair constituting an input transistor pair;

a first resistor connected to a first signal terminal of said first transistor and a first signal terminal of said second transistor;

a first current flowing through said first transistor and a second current flowing through said second transistor;

a second differential pair of third and fourth transistors, said second differential pair constituting an output transistor pair;

a second resistor connected to a first signal terminal of said third transistor and a first signal terminal of said fourth transistor;

a third current flowing through said third transistor and a fourth current flowing through said fourth transistor;

said third current having a first relationship with said first current to contain a component proportional to said input signal, and said fourth current having a second relationship with said second current to contain a component proportional to said input signal;

a fifth current flowing through said first resistor in response to said applied differential input signal: and a current path connected to said first signal terminals of said third and fourth transistors, thereby allowing a sixth current to flow through said second resistor;

a bias voltage being applied to a control terminal of said third transistor and a control terminal of said fourth transistor; and first and second output signals being derived from said first signal terminal of said third transistor and said first signal terminal of said fourth transistor, respectively;

(b) a third differential pair of fifth and sixth transistors whose first signal terminals are coupled together, and a fourth differential pair of seventh and eighth transistors whose first signal terminals are coupled together;

said coupled first signal terminals of said fifth and sixth transistors being applied with said first output signal of said converter, thereby driving said third differential pair;

said coupled first signal terminals of said seventh and eighth transistors being applied with said second output signal of said converter, thereby driving said fourth differential pair;

a control terminal of said fifth transistor and a control terminal of said eighth transistor being coupled together, and a control terminal of said sixth transistor and a control terminal of said seventh transistor being coupled together;

a second signal terminal of said fifth transistor and a second signal terminal of said seventh transistor being coupled together, and a second signal terminal of said sixth transistor and a second signal terminal of said eighth transistor being coupled together;

wherein a first input signal is applied across said coupled control terminals of said fifth and eighth transistors and said coupled control terminals of said sixth and seventh transistors;

and wherein a second input signal is applied across control terminals of said first and second transistors in said converter.

19. A multiplier as claimed in claim 18, wherein said first to eighth transistors are bipolar transistors.

* * * * *

UNITED STATES PATENT AND TRADEMARK OFFICE
CERTIFICATE OF CORRECTION

PATENT NO. : 5,774,020
DATED : June 30, 1998
INVENTOR(S) : Katsuji KIMURA

It is certified that error appears in the above-identified patent and that said Letters Patent is hereby corrected as shown below:

Column 4, line 45, delete "$V_{BB1}$" and insert -- $V_{BE1}$ --.

Column 4, line 64, delete "$V_{BB2}$ and $V_{BB4}$" and insert -- $V_{BE2}$ and $V_{BE4}$ --.

Column 7, line 60, delete "SIN" and insert -- S/N --.

Column 22, line 32 (equation 56), delete "i" and insert -- -i --

Signed and Sealed this

Seventh Day of September, 1999

Attest:

Q. TODD DICKINSON

*Attesting Officer*  Acting Commissioner of Patents and Trademarks